(12) United States Patent
Ozawa et al.

(10) Patent No.: US 8,553,828 B2
(45) Date of Patent: Oct. 8, 2013

(54) CLOCK DATA RESTORATION DEVICE

(75) Inventors: Seiichi Ozawa, Wako (JP); Shuhei Yamamoto, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 3 days.

(21) Appl. No.: 13/386,552

(22) PCT Filed: Jul. 14, 2010

(86) PCT No.: PCT/JP2010/061875
§ 371 (c)(1),
(2), (4) Date: Apr. 4, 2012

(87) PCT Pub. No.: WO2011/010581
PCT Pub. Date: Jan. 27, 2011

(65) Prior Publication Data
US 2012/0187990 A1    Jul. 26, 2012

(30) Foreign Application Priority Data
Jul. 24, 2009    (JP) ................................ P2009-173243

(51) Int. Cl.
*H04L 25/00*    (2006.01)

(52) U.S. Cl.
USPC .......................................... 375/374; 375/376

(58) Field of Classification Search
USPC ........................ 375/355, 371, 373, 374, 376
See application file for complete search history.

(56) References Cited

U.S. PATENT DOCUMENTS

| 5,297,164 | A | 3/1994 | McCabe | |
|---|---|---|---|---|
| 2003/0174003 | A1* | 9/2003 | Nogami | 327/156 |
| 2006/0145772 | A1* | 7/2006 | Xiu et al. | 331/45 |
| 2011/0156779 | A1* | 6/2011 | Kim | 327/158 |

FOREIGN PATENT DOCUMENTS

| JP | 62-029236 A | 2/1987 |
|---|---|---|
| JP | 05-075653 A | 3/1993 |
| JP | 06-229236 A | 8/1994 |

OTHER PUBLICATIONS

Notice of Allowance issued by the Korean Patent Office in Korean Application No. 10-2011-7028122 dated Sep. 26, 2012.
Rick Walker, "Clock and Data Recovery for Serial Digital Communication focusing on bang-bang loop CDR design methodology ", Feb. 2002, 80 pages.

* cited by examiner

*Primary Examiner* — David B. Lugo
(74) *Attorney, Agent, or Firm* — Sughrue Mion, PLLC

(57) ABSTRACT

A clock data restoration device (1A) includes a sampler portion (11), a phase comparison portion (12), a drive portion (13), a charge pump (14), a capacitive element (15), a potential adjustment portion (16) and a voltage control oscillator (17). The phase comparison portion (12) outputs a signal (UP) that becomes a significant value when the phase of a clock (CKX) delays with respect to an input digital signal, and outputs a signal (DN) that becomes a significant value when the phase advances. The drive portion (13) increases or decreases a value δ to or from a variable Δ when the signals (UP) and (DN) become a significant value, and increases or decrease a value N to or from the variable Δ when the value of the variable Δ is equal to or more than +N or when the value of the variable Δ is equal to or less than −N, and signals (UPFRQ) and (DNFRQ) are output to the charge pump (14). The potential adjustment portion (16) increases or decreases a potential at a first end of a capacitive element (15) based on the signals (UP) and (DN).

9 Claims, 24 Drawing Sheets

*Fig.9*

| D_A | DX | D_B | UP | DN | State |
|---|---|---|---|---|---|
| 0 | 0 | 0 | 0 | 0 | Hold |
| 0 | 0 | 1 | 0 | 1 | Down |
| 0 | 1 | 0 | 0 | 0 | Error(Hold) |
| 0 | 1 | 1 | 1 | 0 | Up |
| 1 | 0 | 0 | 1 | 0 | Up |
| 1 | 0 | 1 | 0 | 0 | Error(Hold) |
| 1 | 1 | 0 | 0 | 1 | Down |
| 1 | 1 | 1 | 0 | 0 | Hold |

CLOCK DATA RESTORATION DEVICE

This application is a National Stage of International Application No. PCT/JP2010/061875 filed Jul. 14, 2010, claiming priority based on Japan Patent Application No. 2009-173243 filed Jul. 24, 2009 the contents of all of which are incorporated herein by reference in their entirety.

TECHNICAL FIELD

The present invention relates to a device that restores a clock and data based on an input digital signal.

BACKGROUND ART

In a digital signal that is output from a transmitter, when a clock is not transmitted simultaneously, it is necessary for the side of a receiver thereof to restore a clock and data. A clock data restoration device that performs such restoration is disclosed in, for example, non-patent literature 1. The clock data restoration device disclosed in this document includes a sampler portion, a digital phase comparison portion, a charge pump, a loop filter and a voltage control oscillator. Depending on the structure of the phase comparator used, the clock data restoration device has a bang-bang type PLL (phase lock loop) structure or an Alexander type PLL structure.

The clock data restoration device operates as follows. In the sampler portion, the value of an input digital signal is sampled, held and output with timing indicated by the clock output from the voltage control oscillator. In the phase comparison portion, based on the value output from the sampler portion, the phase of the clock output from the voltage control oscillator and the phase of the input digital signal are compared, and a phase difference signal indicating the phase difference between them is output. The charge pump that inputs the phase difference signal outputs a charge and discharge current corresponding to the phase difference indicated by the phase difference signal.

This charge and discharge current is input to the loop filter. A control voltage value output from the loop filter is input to the voltage control oscillator. Then, a clock having a frequency corresponding to the control voltage value is output from the voltage control oscillator, and this clock is fed to the sampler portion. The clock that has been restored from the input digital signal as described above is output from the voltage control oscillator; the data restored from the input digital signal is output from the sampler portion.

CITATION LIST

Non Patent Literature

Non-patent literature 1: Rick Walker, "Clock and Data Recovery for Serial Digital Communication focusing on bang-bang loop CDR design methodology", ISSCC Short Course, February 2002

SUMMARY OF INVENTION

Technical Problem

In general, a loop filter includes a resistor and a capacitive element. The first end of the resistor is connected to the output end of a charge pump, and is also connected to the input end of a voltage control oscillator. The second end of the resistor is connected through the capacitive element to a reference potential. The characteristic of a bang-bang type clock data restoration device including the loop filter described above is expressed by formulas below.

$$\theta = K_{VCO} \cdot Ip \cdot R / fo \quad (1)$$

$$\zeta = 2 \cdot R \cdot C \cdot fo \quad (2)$$

Here, $K_{VCO}$, [Hz/V] is the gain of the voltage control oscillator, Ip [A] is the magnitude of the charge and discharge current output from the charge pump, R [Ω] is the resistance value of the resistor, C [F] is the capacitance value of the capacitive element and fo [bit/sec.] is the bit rate of the input digital signal.

θ represents the amount of phase shift in the voltage control oscillator shifted by one phase comparison operation performed by the phase comparison portion. When this phase shift amount θ is large, though the trackability of the jitter of the input digital signal is enhanced, the self-jitter is disadvantageously increased. It is therefore important to set the phase shift amount θ to an appropriate value. ζ is a stability factor that represents the ratio between the second feedback to the first feedback. As this stability factor ζ is increased, the ratio of the first feedback is increased, and stability is increased.

Hence, it is desirable to increase the stability factor ζ while keeping the phase shift amount θ constant; and in order to achieve this, it is desirable to increase the capacitance value C of the capacitive element of the loop filter. However, the increasing of the capacitance value C leads to an increased area of the capacitive element, and this disadvantageously results in an increased cost. This problem is significant especially when the clock data restoration device is incorporated in an LSI.

The present invention is made to solve the forgoing problem; an object of the present invention is to provide a clock data restoration device that has a satisfactory characteristic while reducing the increase in the area of a capacitive element of a loop filter.

Solution to Problem

According to the present invention, there is provided a clock data restoration device that restores a clock and data based on an input digital signal, the clock data restoration device including: (1) a sampler portion that inputs a clock CK and a clock CKX which have a same frequency and whose phases differ by π, that inputs the digital signal and that samples, holds and outputs a value D of the digital signal at a time indicated by the clock CK and a value DX of the digital signal at a time indicated by the clock CKX; (2) a phase comparison portion that compares, based on the value D and the value DX output from the sampler portion, phases of the digital signal and the clock CKX every period of the clock CKX, and that outputs a first phase difference signal which is a significant value when the phase of the clock CKX delays with respect to the digital signal or a second phase difference signal which is a significant value when the phase of the clock CKX advances with respect to the digital signal; (3) a drive portion which inputs the first phase difference signal and the second phase difference signal output from the phase comparison portion, which, when it is assumed that Δ represents a variable, that the value δ is added to the variable Δ if the first phase difference signal becomes a significant value every period, that the value δ is subtracted from the variable Δ if the second phase difference signal becomes a significant value every period, that the value N is subtracted from the variable Δ if the value of the variable Δ becomes equal to or more than +N and that the value N is added to the variable Δ if the value of the variable Δ becomes equal to or less than −N, outputs, if the value of the variable Δ becomes equal to or more than +N, a third phase difference signal indicating this fact and which outputs, Δ if the value of the variable Δ becomes equal to or less than −N, a fourth phase difference signal indicating this fact (where 0<δ<N); (4) a charge pump that outputs a charge and discharge current based on the third phase difference signal and the fourth phase difference signal output from the drive portion; (5) a capacitive element that has a first end connected to an output end of the charge pump and a second end connected to a reference potential, that inputs the charge and discharge current output from the charge pump to the first end, that is charged and discharged and that outputs a voltage value at the first end; (6) a potential adjustment portion that inputs the first phase difference signal and the second phase difference signal output from the phase comparison portion and that increases or decreases a potential at the first end of the capacitive element according to a phase difference indicated by the first and second phase difference signals; and (7) a voltage control oscillator that inputs the voltage value at the first end of the capacitive element and that outputs, to the sampler portion, as the clock CK and the clock CKX, an oscillation signal having a frequency corresponding to the input voltage value.

In the clock data restoration device, the sampler portion, the phase comparison portion, the drive portion, the charge pump, the capacitive element, the potential adjustment portion and the voltage control oscillator form a loop. In the loop, the drive portion and the charge pump are provided in parallel to the potential adjustment portion. In the loop, the charge pump inputs the charge and discharge current to the capacitive element such that the phase difference between the input digital signal and the clock is reduced, and the potential adjustment portion adjusts the potential at the first terminal of the capacitive element. In the state where the operation of the loop is stable, the value D output from the sampler portion is data that is restored from the input digital signal, and the clocks output from the voltage control oscillator are clocks that are restored from the input digital signal.

The processing on the variable Δ in the drive portion may be performed either every period or every duration of continuous two or more predetermined numbers of periods. When the processing on the variable Δ is assumed to be performed per duration of M periods (M is an integer that is equal to or more than 1), if the first phase difference signal UP becomes a significant value at a $m_1$ period among the M periods and the second phase difference signal DN becomes a significant value at a $m_2$ period, $(m_1−m_2)$ δ is added to the value of the variable Δ, with the result that the variable Δ is assumed to be the value obtained by performing the above addition. For example, the contact N is an integer that is equal to or more than 2, and the constant δ is a value 1.

Preferably, in the clock data restoration device of the present invention, the drive portion includes: (a) a decimeter portion that inputs the first phase difference signal and the second phase difference signal output from the phase comparison portion and that outputs a value mδ indicating a difference m of a number of periods at which each of the first phase difference signal and the second phase difference signal becomes a significant value during duration of a predetermined number of periods; and (b) a delta sigma modulation portion that inputs the value mδ output from the decimeter portion, that adds the value mδ to the variable Δ, that outputs, if the value of the variable Δ becomes equal to or more than +N, the third phase difference signal indicating this fact and subtracts the value N from the variable Δ and that outputs, if the value of the variable Δ becomes equal to or less than −N, the fourth phase difference signal indicating this fact and adds the value N to the variable Δ.

Preferably, the drive portion includes an integration portion that inputs the value mδ output from the decimeter portion and that outputs a value corresponding to a value obtained by accumulatively adding the value mδ, and the delta sigma modulation portion adds, to the variable Δ, the value mδ output from the decimeter portion and the value output from the integration portion. Preferably, the integration portion includes a limiter portion that prevents the value obtained by accumulatively adding the value mδ from exceeding a predetermined range.

Preferably, in the clock data restoration device of the present invention, the potential adjustment portion includes: (a) a first buffer that inputs the first phase difference signal output from the phase comparison portion; (b) a first capacitive element that is provided between an output end of the first buffer and the first end of the capacitive element; (c) a second buffer that inputs the second phase difference signal output from the phase comparison portion and that outputs a signal of a polarity opposite a polarity of the output of the first buffer; and (d) a second capacitive element that is provided between an output end of the second buffer and the first end of the capacitive element.

Preferably, the potential adjustment portion includes: (e) a first resistor that is provided between the output end of the first buffer and the first capacitive element; and (f) a second resistor that is provided between the output end of the second buffer and the second capacitive element. Preferably, the potential adjustment portion includes: (g) an LDO power supply that drives the first buffer and the second buffer. Preferably, the potential adjustment portion includes: (h) a pulsar portion that outputs a pulse signal having a same period as the clock CL and the clock CKX; (i) a first AND circuit portion that is provided between the first buffer and the first capacitive element, that performs an AND operation on an output pulse signal of the pulsar portion and an output value of the first buffer and that outputs a value of the AND operation to the first capacitive element; and (j) a second AND circuit portion that is provided between the second buffer and the second capacitive element, that performs an AND operation on the output pulse signal of the pulsar portion and an output value of the second buffer and that outputs a value of the AND operation to the second capacitive element.

Preferably, the clock data restoration device of the present invention, further includes: a pulsar portion that is provided between the drive portion and the charge pump, that determines that the third phase difference signal and the fourth phase difference signal output form the drive portion have a predetermined pulse width and that outputs the third phase difference signal and the fourth phase difference signal to the charge pump, in which the charge pump outputs a charge and discharge current based on the third phase difference signal and the fourth phase difference signal that are output from the drive portion and that are determined to have the predetermined pulse width by the pulsar portion.

Advantageous Effects of Invention

A clock data restoration device according to the present invention can have a satisfactory characteristic while reducing the increase in the area of a capacitive element of a loop filter.

BRIEF DESCRIPTION OF DRAWINGS

FIG. 9 is a table illustrating the function of a phase comparison portion 12 included in the clock data restoration device 1A of the first embodiment;

DESCRIPTION OF EMBODIMENTS

Embodiments of the present invention will be described in detail below with reference to accompanying drawings. In the description of the drawings, like symbols are given to like elements, and their description will not be repeated. In the following description, the configuration of comparative examples will first be discussed, and then the configuration of the embodiments of the present invention will be discussed by comparison with the comparative examples.

First Comparative Example

Figure 1:
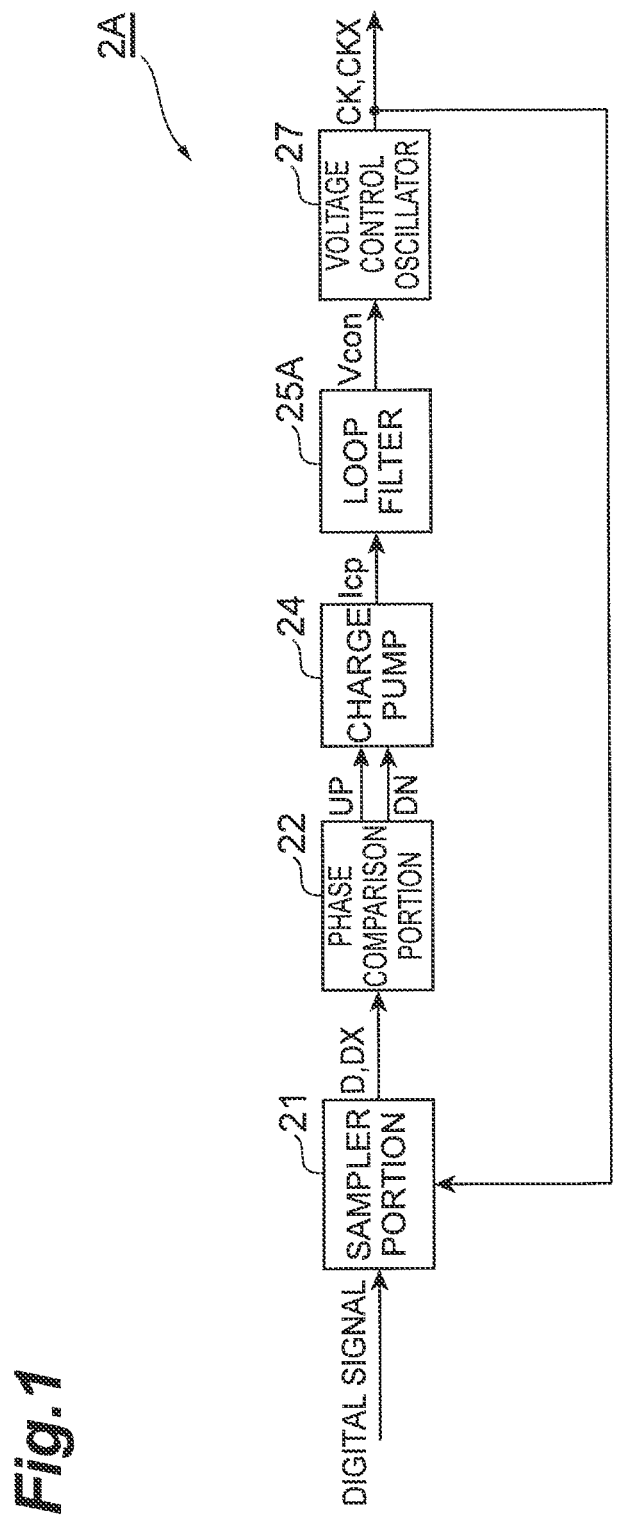
FIG. 1 is a diagram showing the configuration of a clock data restoration device 2A of a first comparative example.

FIG. 1 is a diagram showing the configuration of a clock data restoration device 2A of a first comparative example. The clock data restoration device 2A of the first comparative example shown in this figure is a device that restores a clock and data based on an input digital signal; the clock data restoration device 2A includes a sampler portion 21, a phase comparison portion 22, a charge pump 24, a loop filter 25A and a voltage control oscillator 27.

The sampler portion 21 inputs a clock CK and a clock CKX which are output from the voltage control oscillator 27 at the same period and whose phases differ by π, and also inputs a digital signal to be restored. The sampler portion 21 samples, holds and outputs to the phase comparison portion 22 the value D of the input digital signal at the time indicated by the clock CK and the value DX of the input digital signal at the time indicated by the clock CKX. The clock CK indicates the intermediate time of the individual bits of the input digital signal. The clock CKX indicates about the bit transition time of the input digital signal.

Based on the value D and the value DX output from the sampler portion 21, the phase comparison portion 22 compares the phases of the input digital signal and the clock CKX every period of the clock CKX. Then, the phase comparison portion 22 outputs, to the charge pump 24, a first phase difference signal UP that becomes a significant value when the phase of the clock CKX delays with respect to the input digital signal. The phase comparison portion 22 also outputs, to the charge pump 24, a second phase difference signal DN that becomes a significant value when the phase of the clock CKX advances with respect to the input digital signal.

The charge pump 24 inputs the first phase difference signal UP and the second phase difference signal DN output from the phase comparison portion 22. Then, the charge pump 24 outputs, to the loop filter 25A, a charge and discharge current Icp corresponding to the phase difference indicated by these signals UP and DN.

The loop filter 25A inputs the charge and discharge current Icp output from the charge pump 24, and outputs, to the voltage control oscillator 27, a control voltage value Vcon that is increased or decreased corresponding to the charge and discharge current Icp.

The voltage control oscillator 27 inputs the control voltage value Vcon output from the loop filter 25A, and outputs, as the clocks CK and CKX, an oscillation signal having a frequency corresponding to the control voltage value Vcon.

In the clock data restoration device 2A described above, the sampler portion 21, the phase comparison portion 22, the charge pump 24, the loop filter 25A and the voltage control oscillator 27 form a loop. In this loop, in order for the phase difference between the input digital signal and the clock CKX to be reduced, the charge and discharge current Icp is input from the charge pump 24 to the loop filter 25A. In the state where the operation of the loop is stable, the value D output from the sampler portion 21 is data that is restored from the input digital signal, and the clocks CK and CKX output from the voltage control oscillator 27 are clocks that are restored from the input digital signal.

Figure 2:
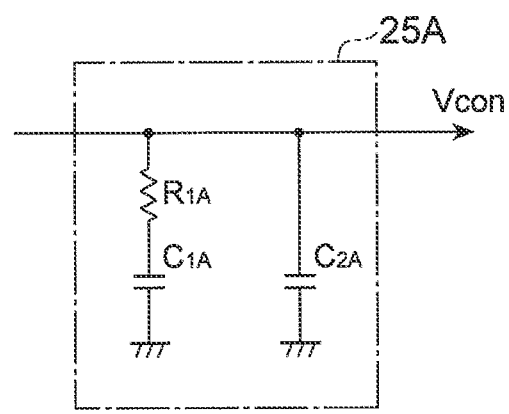
FIG. 2 is a circuit diagram of a loop filter 25A included in the clock data restoration device 2A of the first comparative example.

FIG. 2 is a circuit diagram of the loop filter 25A included in the clock data restoration device 2A of the first comparative example. The loop filter 25A of the first comparative example includes a resistor $R_{1A}$, a capacitive element $C_{1A}$ and a capacitive element $C_{2A}$. One end of the resistor $R_{1A}$ is connected to an output end of the charge pump 24 and an input end of the voltage control oscillator 27; the other end of the resistor $R_{1A}$ is connected to a ground potential through the capacitive element $C_{1A}$. One end of the capacitive element $C_{2A}$ is connected to the output end of the charge pump 24 and the input end of the voltage control oscillator 27; the other end of the capacitive element $C_{2A}$ is connected to the ground potential.

The charge and discharge current Icp that is output from the charge pump 24 and that is input to the loop filter 25A flows into the capacitive element $C_{1A}$ through the resistor $R_{1A}$, and changes the amount of charge accumulated in the capacitive element $C_{1A}$. The control voltage value Vcon that is output from the loop filter 25A and that is input to the voltage control oscillator 27 includes a voltage value corresponding to the amount of charge accumulated in the capacitive element $C_{1A}$ and a voltage drop in the resistor $R_{1A}$ resulting from a current flowing through the resistor $R_{1A}$.

Figure 3:
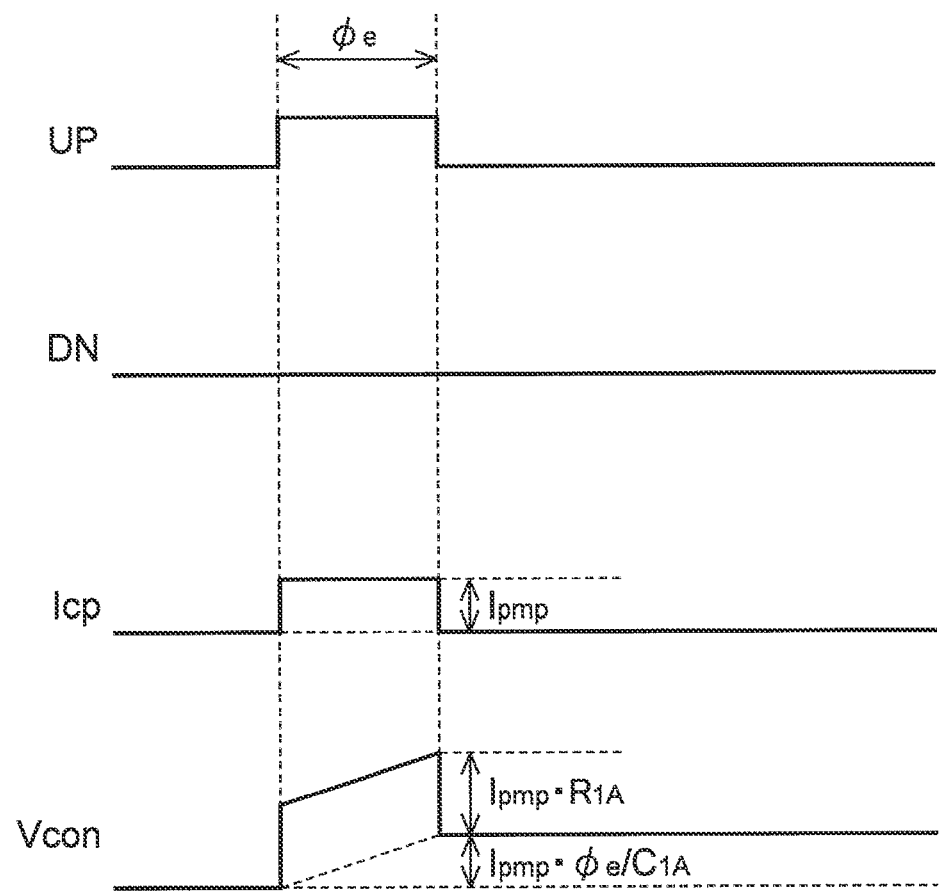
FIG. 3 is a diagram showing an example of the waveforms of a first phase difference signal UP, a second phase difference signal DN, a charge and discharge current Icp and a control voltage value Vcon in the clock data restoration device 2A of the first comparative example.

FIG. 3 is a diagram showing an example of the waveforms of the first phase difference signal UP, the second phase difference signal DN, the charge and discharge current Icp and a control voltage value Vcon in the clock data restoration device 2A of the first comparative example. Here, it is assumed that the phase of the clock CKX delays with respect to the input digital signal and that the first phase difference signal UP output from the phase comparison portion 22 is input as a pulse to the charge pump 24. Although this figure shows the waveforms when the loop filter 25A does not include a capacitive element $C_{1B}$, when the loop filter 25A includes the capacitive element $C_{1B}$, the waveform of the control voltage value Vcon is blunt.

As shown in the figure, the pulse of the first phase difference signal UP output from the phase comparison portion 22 has a pulse width $\phi e$. The value of the charge and discharge current Icp that is output from the charge pump 24 and that is input to the loop filter 25A is a current value Ipmp over a pulse period of the first phase difference signal UP.

The resistance value of the resistor $R_{1A}$ included in the loop filter 25A is assumed to be $R_1$, and the capacitance value of the capacitive element $C_{1A}$ is assumed to be $C_1$. The control voltage value Vcon that is output from the loop filter 25A and that is input to the voltage control oscillator 27 includes, over the pulse period of the first phase difference signal UP, a voltage value corresponding to the amount of charge accumulated in the capacitive element $C_{1A}$ and a voltage drop (Ipmp·$R_1$) in the resistor $R_{1A}$ resulting from a current flowing through the resistor $R_{1A}$. After the pulse period of the first phase difference signal UP, the control voltage value Vcon is a voltage value (Ipmp·$\phi e/C_1$) corresponding to the amount of charge accumulated in the capacitive element $C_{1A}$.

In the clock data restoration device 2A of the first comparative example, as described above, in order to increase a stability factor $\zeta$ while keeping a phase shift amount $\theta$ constant, it is desirable to increase the capacitance value of the capacitive element $C_{1A}$ of the loop filter 25A. However, the increasing of the capacitance of the capacitive element $C_{1A}$ leads to an increased area of the capacitive element $C_{1A}$, and this disadvantageously results in an increased cost. Hence, in order to solve this problem, the configuration of a second comparative example shown in FIG. 4 can be considered.

Second Comparative Example

Figure 4:
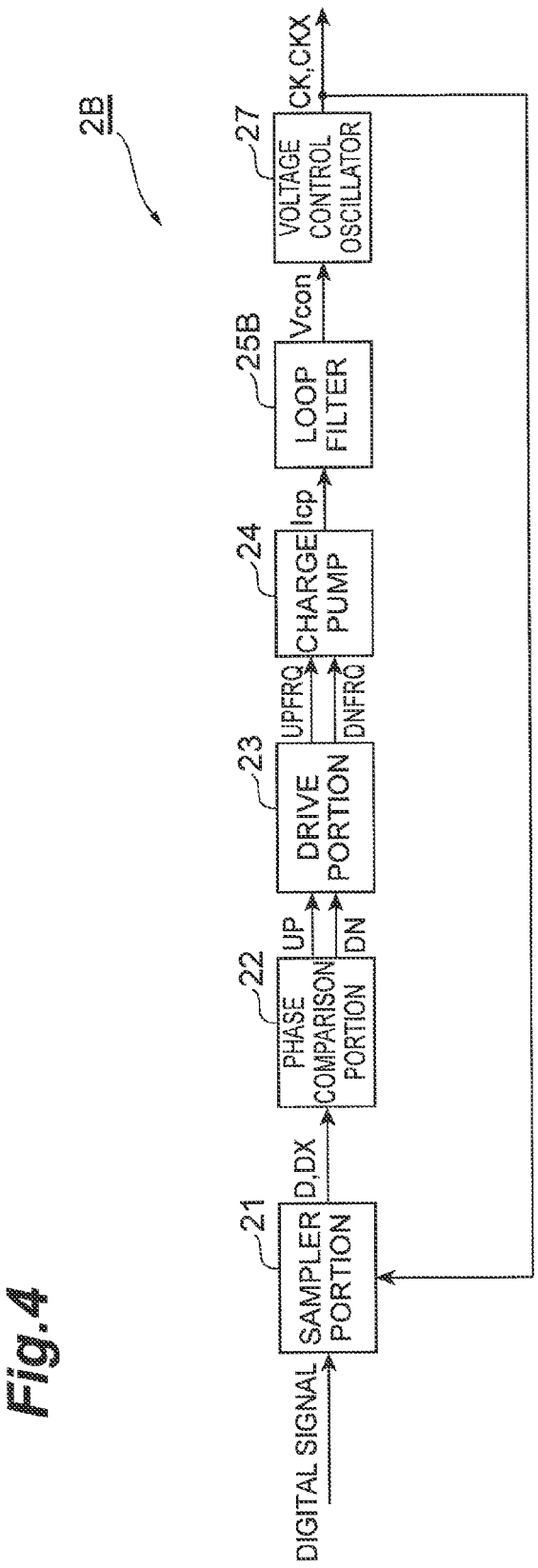
FIG. 4 is a diagram showing the configuration of a clock data restoration device 2B of a second comparative example.

FIG. 4 is a diagram showing the configuration of a clock data restoration device 2B of the second comparative example. The clock data restoration device 2B of the second comparative example shown in this figure is a device that restores a clock and data based on an input digital signal; the clock data restoration device 2B includes the sampler portion 21, the phase comparison portion 22, a drive portion 23, the charge pump 24, a loop filter 25B and the voltage control oscillator 27.

As understood by comparison with the configuration of the clock data restoration device 2A of the first comparative example shown in FIG. 1, the clock data restoration device 2B of the second comparative example shown in FIG. 4 differs from the clock data restoration device 2A in that the drive portion 23 is further included and that the loop filter 25B is included instead of the loop filter 25A.

The drive portion 23 inputs the first phase difference signal UP and the second phase difference signal DN output from the phase comparison portion 22. Here, in the drive portion 23, a variable Δ below is assumed and used. When the first phase difference signal UP becomes a significant value every period, a value δ is added to the variable Δ; when the second phase difference signal DN becomes a significant value every period, the value δ is subtracted from the variable Δ; when the value of the variable Δ becomes equal to or more than +N, a value N is subtracted from the variable Δ; when the value of the variable Δ becomes equal to or less than −N, the value N is added to the variable Δ. A relationship 0<δ<N holds true between the constant N and the constant δ. For example, the constant N is an integer that is equal to or more than 2, and the constant δ is a value 1. When the value of the variable Δ that is assumed as described above becomes equal to or more than +N, the drive portion 23 outputs, to the charge pump 24, a third phase difference signal UPFRQ indicating the above assumption whereas, when the value of the variable Δ becomes equal to or less than −N, the drive portion 23 outputs, to the charge pump 24, a fourth phase difference signal DNFRQ indicating the above assumption.

The charge pump 24 inputs the third phase difference signal UPFRQ and the fourth phase difference signal DNFRQ output from the drive portion 23. Then, the charge pump 24 outputs, to the loop filter 25B, the charge and discharge current Icp corresponding to the phase difference indicated by the signals UPFRQ and DNFRQ. The loop filter 25B inputs the charge and discharge current Icp output from the charge pump 24, and outputs, to the voltage control oscillator 27, the control voltage value Vcon that is increased or decreased corresponding to the charge and discharge current Icp.

Figure 5:
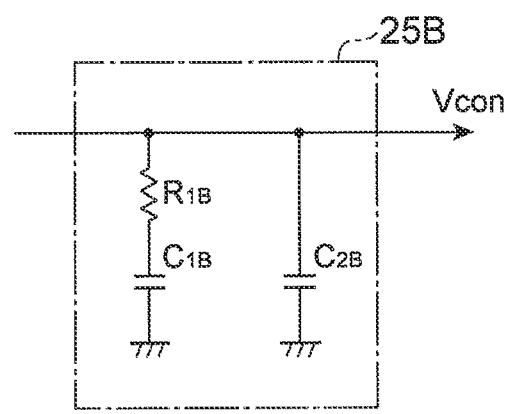
FIG. 5 is a circuit diagram of a loop filter 25B included in the clock data restoration device 2B of the second comparative example.

FIG. 5 is a circuit diagram of the loop filter 25B included in the clock data restoration device 2B of the second comparative example. The loop filter 25B of the second comparative example includes a resistor $R_{1B}$, the capacitive element $C_{1B}$ and a capacitive element $C_{2B}$. One end of the resistor $R_{1B}$ is connected to the output end of the charge pump 24 and the input end of the voltage control oscillator 27; the other end of the resistor $R_{1B}$ is connected to the ground potential through the capacitive element $C_{1B}$. One end of the capacitive element $C_{2B}$ is connected to the output end of the charge pump 24 and the input end of the voltage control oscillator 27; the other end of the capacitive element $C_{2B}$ is connected to the ground potential.

As understood by comparison with the configuration of the loop filter 25A of the first comparative example shown in FIG. 2, the loop filter 25B of the second comparative example shown in FIG. 5 differs from the loop filter 25A in the resistance value of the resistor and the capacitance value of the capacitive element. Specifically, when, in the first comparative example, it is assumed that the resistance value of the resistor $R_{1A}$ is $R_1$, the capacitance value of the capacitive element $C_{1A}$ is $C_1$ and the capacitance value of the capacitive element $C_{2A}$ is $C_2$, in the second comparative example, the resistance value of the resistor $R_{1B}$ is $R_1 \cdot N$, the capacitance value of the capacitive element $C_{1B}$ is $C_1/N$ and the capacitance value of the capacitive element $C_{2B}$ is $C_2/N$.

As described above, in the clock data restoration device 2B of the second comparative example, the drive portion 23 is provided between the phase comparison portion 22 and the charge pump 24, and thus it is possible not only to reduce the increase in the area of the capacitive element $C_{1B}$ of the loop filter 25B but also to increase the stability factor $\zeta$ while keeping the phase shift amount $\theta$ constant. However, since the drive portion 23 provided in the clock data restoration device 2B of the second comparative example becomes a delay element having an average of $0.5 \cdot N \cdot T$, the operation of the clock data restoration device 2B can be considered to become unstable. T is the period of the clocks CK and CKX. Hence, in order for the foregoing problem to be solved, the configuration of the first embodiment shown in FIG. 6 can be considered.

First Embodiment

Figure 6:
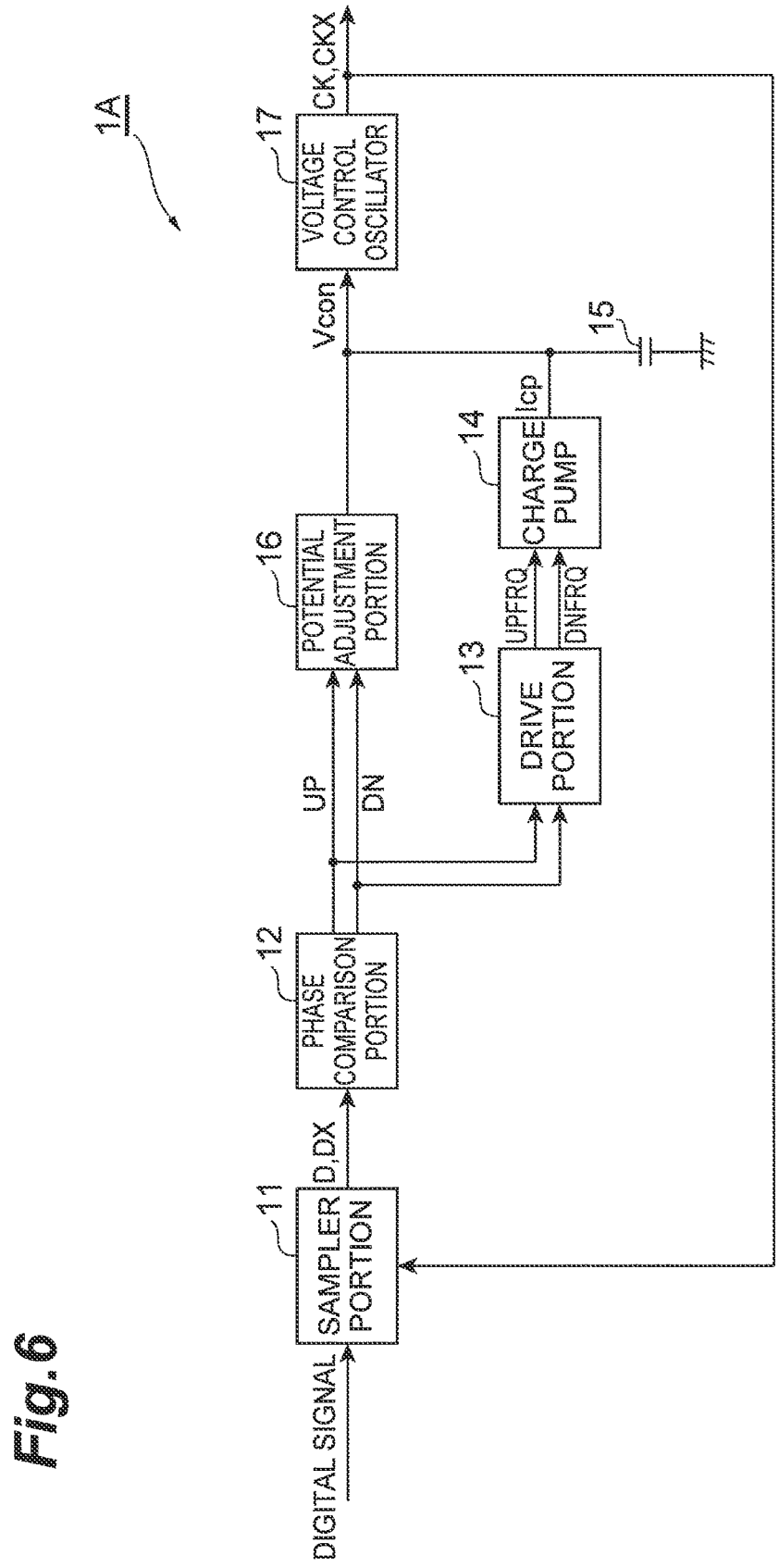
FIG. 6 is a diagram showing the configuration of a clock data restoration device 1A of a first embodiment.

FIG. 6 is a diagram showing the configuration of a clock data restoration device 1A of the first embodiment. The clock data restoration device 1A shown in this figure is a device that restores a clock and data based on an input digital signal; the clock data restoration device 1A includes a sampler portion 11, a phase comparison portion 12, a drive portion 13, a charge pump 14, a capacitive element 15, a potential adjustment portion 16 and a voltage control oscillator 17.

The sampler portion 11 inputs a clock CK and a clock CKX which are output from the voltage control oscillator 17 at the same period and whose phases differ by $\pi$, and also inputs a digital signal to be restored. The sampler portion 11 samples, holds and outputs to the phase comparison portion 12 the value D of the input digital signal at the time indicated by the clock CK and the value DX of the input digital signal at the time indicated by the clock CKX. The clock CK indicates the intermediate time of the individual bits of the input digital signal. The clock CKX indicates about the bit transition time of the input digital signal.

Based on the value D and the value DX output from the sampler portion 11, the phase comparison portion 12 compares the phases of the input digital signal and the clock CKX every period of the clock CKX. Then, the phase comparison portion 12 outputs, to the drive portion 13 and the potential adjustment portion 16, a first phase difference signal UP that becomes a significant value when the phase of the clock CKX delays with respect to the input digital signal. The phase comparison portion 12 also outputs, to the drive portion 13 and the potential adjustment portion 16, a second phase difference signal DN that becomes a significant value when the phase of the clock CKX advances with respect to the input digital signal.

The drive portion 13 inputs the first phase difference signal UP and the second phase difference signal DN output from the phase comparison portion 12. Here, in the drive portion 13, a variable $\Delta$ below is assumed and used. When the first phase difference signal UP becomes a significant value every period, a value $\delta$ is added to the variable $\Delta$; when the second phase difference signal DN becomes a significant value every period, the value $\delta$ is subtracted from the variable $\Delta$; when the value of the variable $\Delta$ becomes equal to or more than $+N$, a value N is subtracted from the variable $\Delta$; when the value of the variable $\Delta$ becomes equal to or less than $-N$, the value N is added to the variable $\Delta$. A relationship $0 < \delta < N$ holds true between the constant N and the constant $\delta$. For example, the constant N is an integer that is equal to or more than 2, and the constant $\delta$ is a value 1. When the value of the variable $\Delta$ that is assumed as described above becomes equal to or more than $+N$, the drive portion 13 outputs, to the charge pump 14, a third phase difference signal UPFRQ indicating the above assumption whereas, when the value of the variable $\Delta$ becomes equal to or less than $-N$, the drive portion 13 outputs, to the charge pump 14, a fourth phase difference signal DNFRQ indicating the above assumption.

The processing on the variable $\Delta$ in the drive portion 13 may be performed either every period or every duration of continuous two or more predetermined numbers of periods. When the processing on the variable $\Delta$ is assumed to be performed per duration of M periods (M is an integer that is equal to or more than 1), if the first phase difference signal UP becomes a significant value at a $m_1$ period among the M periods and the second phase difference signal DN becomes a significant value at a $m_2$ period, $(m_1 - m_2)\delta$ is added to the value of the variable $\Delta$, with the result that the variable $\Delta$ is assumed to be the value obtained by performing the above addition.

When the value of the variable $\Delta$ obtained by performing the above addition becomes equal to or more than $+N$, the drive portion 13 outputs the third phase difference signal UPFRQ indicating this fact to the charge pump 14, and subtracts the value N from the variable $\Delta$. On the other hand, when the value of the variable $\Delta$ obtained by performing the above addition becomes equal to or less than $-N$, the drive portion 13 outputs the fourth phase difference signal DNFRQ indicating this fact to the charge pump 14, and adds the value N to the variable $\Delta$.

The charge pump 14 inputs the third phase difference signal UPFRQ and the fourth phase difference signal DNFRQ output from the drive portion 13. Then, the charge pump 14 outputs, to the capacitive element 15, the charge and discharge current Icp corresponding to the phase difference indicated by these signals UPFRQ and DNFRQ.

The capacitive element 15 has a first end connected to the output end of the charge pump 14 and a second end connected to the ground potential. The capacitive element 15 inputs the charge and discharge current Icp output from the charge pump 14 to the first end, is charged and discharged and outputs, to the voltage control oscillator 17, the control voltage value Vcon corresponding to the potential at the first end. The capacitance value of the capacitive element 15 is substantially equal to that of the capacitive element $C_{1B}$ of the loop filter 25B of the second comparative example.

The potential adjustment portion 16 inputs the first phase difference signal UP and the second phase difference signal DN output from the phase comparison portion 12. Then, the potential adjustment portion 16 increases or decreases the potential at the first terminal of the capacitive element 15 according to the phase difference indicated by these signals UP and DN.

The voltage control oscillator 17 inputs the control voltage value Vcon output from the first terminal of the capacitive element 15, and outputs an oscillation signal having a frequency corresponding to the control voltage value Vcon as the clocks CK and CKX.

In the clock data restoration device 1A, the sampler portion 11, the phase comparison portion 12, the drive portion 13, the charge pump 14, the capacitive element 15, the potential adjustment portion 16 and the voltage control oscillator 17 form a loop. In the loop, the drive portion 13 and the charge pump 14 are provided in parallel to the potential adjustment portion 16. In the loop, the charge pump 14 inputs the charge and discharge current Icp to the capacitive element 15 such that the phase difference between the input digital signal and the clock CKX is reduced, and the potential adjustment portion 16 adjusts the potential at the first terminal of the capacitive element 15. In the state where the operation of the loop is stable, the value D output from the sampler portion 11 is data that is restored from the input digital signal, and the clocks CK and CKX output from the voltage control oscillator 17 are clocks that are restored from the input digital signal.

Figure 7:
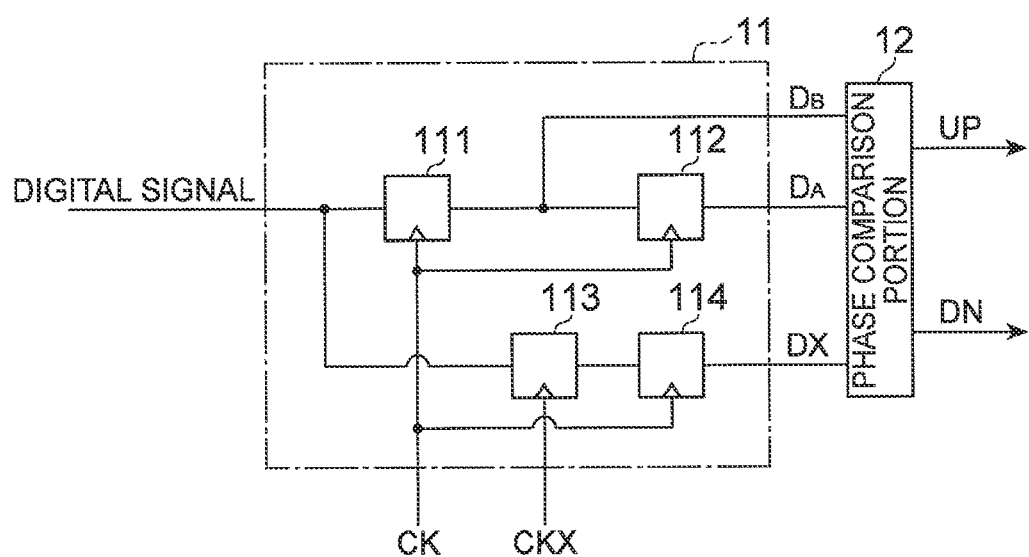
FIG. 7 is a diagram showing an example of the circuit of a sampler portion 11 included in the clock data restoration device 1A of the first embodiment.

FIG. 7 is a diagram showing an example of the circuit of the sampler portion 11 included in the clock data restoration device 1A of the first embodiment. As shown in this figure, the sampler portion 11 includes four D flip-flops 111 to 114.

The flip-flop 111 and the flip-flop 112 are connected in series, and form a shift register. The flip-flop 111 samples and holds the value of the input digital signal with timing indicated by the clock CK, and outputs the held value $D_B$. The flip-flop 112 samples and holds the output value $D_B$ from the flip-flop 111 with timing indicated by the clock CK, and outputs the held value $D_A$.

The flip-flop 113 and the flip-flop 114 are connected in series, and form a shift register. The flip-flop 113 samples and holds the value of the input digital signal with timing indicated by the clock CKX, and outputs the held value. The flip-flop 114 samples and holds the output value from the flip-flop 113 with timing indicated by the clock CK, and outputs the held value DX.

Figure 8:
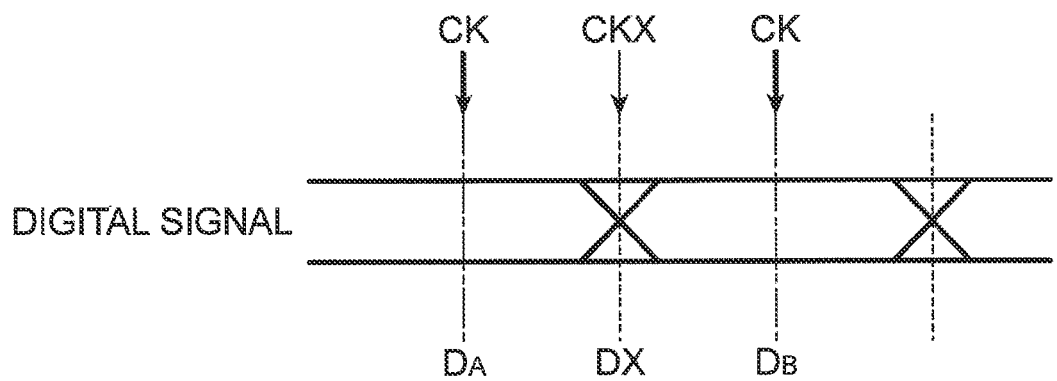
FIG. 8 is a diagram illustrating the operation of the sampler portion 11 included in the clock data restoration device 1A of the first embodiment.

FIG. 8 is a diagram illustrating the operation of the sampler portion 11 included in the clock data restoration device 1A of the first embodiment. This figure schematically shows the eye pattern of the input digital signal, and also shows timings when the clocks CK and CKX indicate sampling of the values $D_A$, DX and $D_B$. As shown in this figure, the clock CK indicates the intermediate time of the individual bits of the input digital signal. The clock CKX indicates about the bit transition time of the input digital signal. The clocks CK and CKX may be two-phase clocks or may be clocks that indicate timings by both the rising and falling of one clock.

FIG. 9 is a table illustrating the function of the phase comparison portion 12 included in the clock data restoration device 1A of the first embodiment. The phase comparison portion 12 inputs the values $D_A$, DX and $D_B$ output from the sampler portion 11 every period, and compares, based on these values, the phases of the input digital signal and the clock CKX. When a relationship "$D_A \neq DX = D_B$" holds true, the phase comparison portion 12 determines that the phase of the clock CKX delays with respect to the input digital signal, outputs the first phase difference signal UP as a significant value and outputs the second phase difference signal DN as a non-significant value. When a relationship "$D_A = DX \neq D_B$" holds true, the phase comparison portion 12 determines that the phase of the clock CKX advances with respect to the input digital signal, outputs the first phase difference signal UP as a non-significant value and outputs the second phase difference signal DN as a significant value. When neither the relationship "$D_A \neq DX = D_B$" nor the relationship "$D_A = DX \neq D_B$" holds true, the phase comparison portion 12 outputs both the first phase difference signal UP and the second phase difference signal DN as non-significant values.

Figure 10:
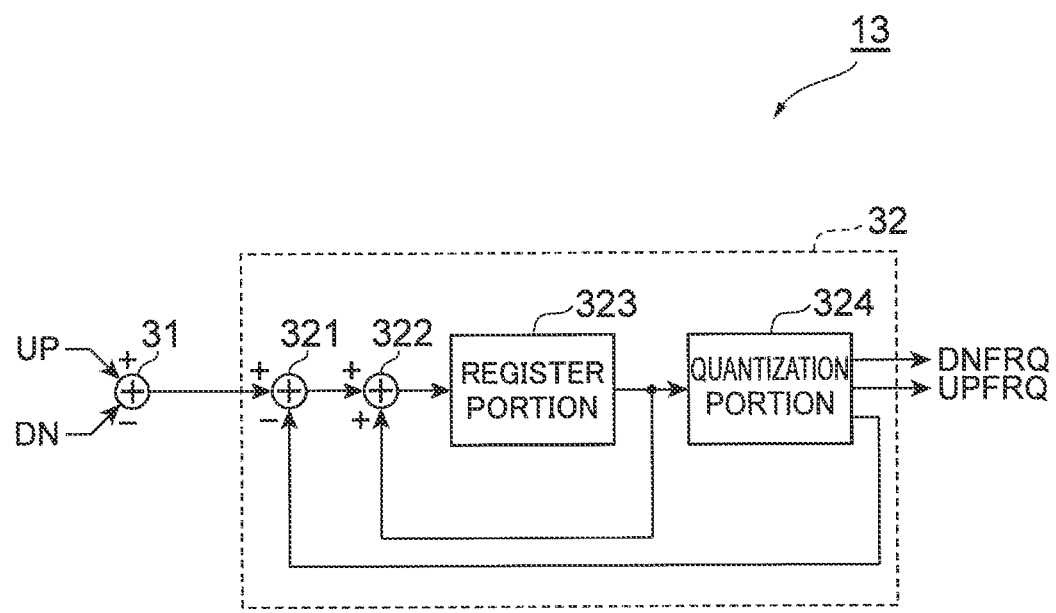
FIG. 10 is a diagram showing an example of the configuration of a drive portion 13 included in the clock data restoration device 1A of the first embodiment.

FIG. 10 is a diagram showing an example of the configuration of the drive portion 13 included in the clock data restoration device 1A of the first embodiment. As shown in the figure, the drive portion 13 includes a decimeter portion 31 and a delta sigma modulation portion 32. In the following description, $\delta=1$.

The decimeter portion 31 inputs the first phase difference signal UP and the second phase difference signal DN output from the phase comparison portion 12, and outputs a value m indicating a difference of the number of periods at which each of the first phase difference signal UN and the second phase difference signal DN becomes a significant value during the duration of predetermined number M periods. Here, the duration of the predetermined number M periods may be either one period or the duration of continuous two or more periods. The letter m is an integer that is equal to or more than −M but equal to or less than +M.

The delta sigma modulation portion 32 includes a subtraction portion 321, an addition portion 322, a register portion 323 and a quantization portion 324. The subtraction portion 321 subtracts the output value of the quantization portion 324 from the output value of the decimeter portion 31, and outputs the value of the result of the subtraction to the addition portion 322. The addition portion 322 adds the output value of the subtraction portion 321 and the output value of the register portion 323, and outputs the value of the result of the addition to the register portion 323. The register portion 323 delays the output value of the addition portion 322 by the duration of the M periods, and outputs the value after the delay to the addition portion 322 and the quantization portion 324.

When the output value of the register portion 323 is equal to or more than +N, the quantization portion 324 outputs the third phase difference signal UPFRQ indicating this fact to the charge pump 14, and outputs +N to the subtraction portion 321. When the output value of the register portion 323 is equal to or less than −N, the quantization portion 324 outputs the fourth phase difference signal DNFRQ indicating this fact to the charge pump 14, and outputs −N to the subtraction portion 321.

A loop including the addition portion 322 and the register portion 323 forms an integration portion that accumulatively adds the output value of the subtraction portion 321; the output value of the register portion 323 becomes the value of the variable Δ. In other words, the delta sigma modulation portion 32 inputs the value m output from the decimeter portion 31, and outputs, from the register portion 323, the value of the result of the addition of the value m to the variable Δ, as the value of the variable Δ. When the value of the variable Δ is equal to or more than +N, the delta sigma modulation portion 32 makes the quantization portion 324 output the third phase difference signal UPFRQ indicating this fact, and makes the subtraction portion 321 subtract the value N from the variable Δ. When the value of the variable Δ is equal to or less than −N, the delta sigma modulation portion 32 makes the quantization portion 324 output the fourth phase difference signal DNFRQ indicating this fact, and makes the subtraction portion 321 add the value N to the variable Δ.

Figure 11:
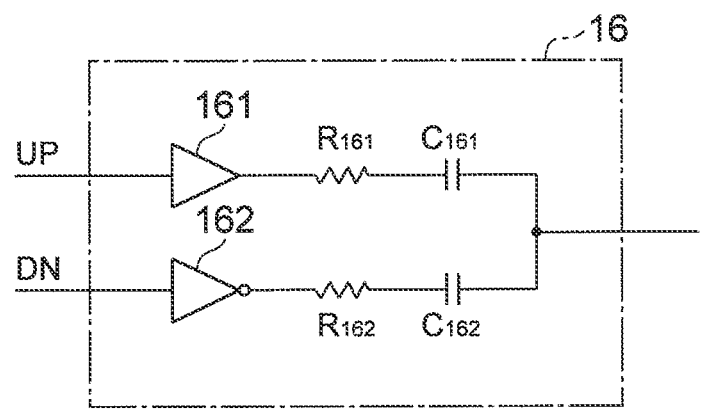
FIG. 11 is a diagram showing an example of the circuit of a potential adjustment portion 16 included in the clock data restoration device 1A of the first embodiment.

FIG. 11 is a diagram showing an example of the circuit of the potential adjustment portion 16 included in the clock data restoration device 1A of the first embodiment. As shown in the figure, the potential adjustment portion 16 includes a first buffer 161, a second buffer 162, a first resistor $R_{161}$, a second resistor $R_{162}$, a first capacitive element $C_{161}$ and a second capacitive element $C_{162}$. The first buffer 161 and the second buffer 162 output signals of opposite polarities. The resistance values of the first resistor $R_{161}$ and the second resistor $R_{162}$ are equal to each other. The capacitance values of the first capacitive element $C_{161}$ and the second capacitive element $C_{162}$ are equal to each other. The first capacitive element $C_{161}$ and the second capacitive element $C_{162}$ can be realized by, for example, metal capacitors.

The first buffer 161 inputs the first phase difference signal UP. The second buffer 162 inputs the second phase difference signal DN. One end of the first resistor $R_{161}$ is connected to the output end of the first buffer 161; the other end of the first resistor $R_{161}$ is connected to the capacitive element 15 through the first capacitive element $C_{161}$. One end of the second resistor $R_{162}$ is connected to the output end of the second buffer 162; the other end of the second resistor $R_{162}$ is connected to the capacitive element 15 through the second capacitive element $C_{162}$.

The potential adjustment portion 16 configured as described above can increase or decrease the potential at the first end of the capacitive element 15 according to the phase difference indicated by the first phase difference signal UP and the second phase difference signal DN output from the phase comparison portion 12.

Figure 12:
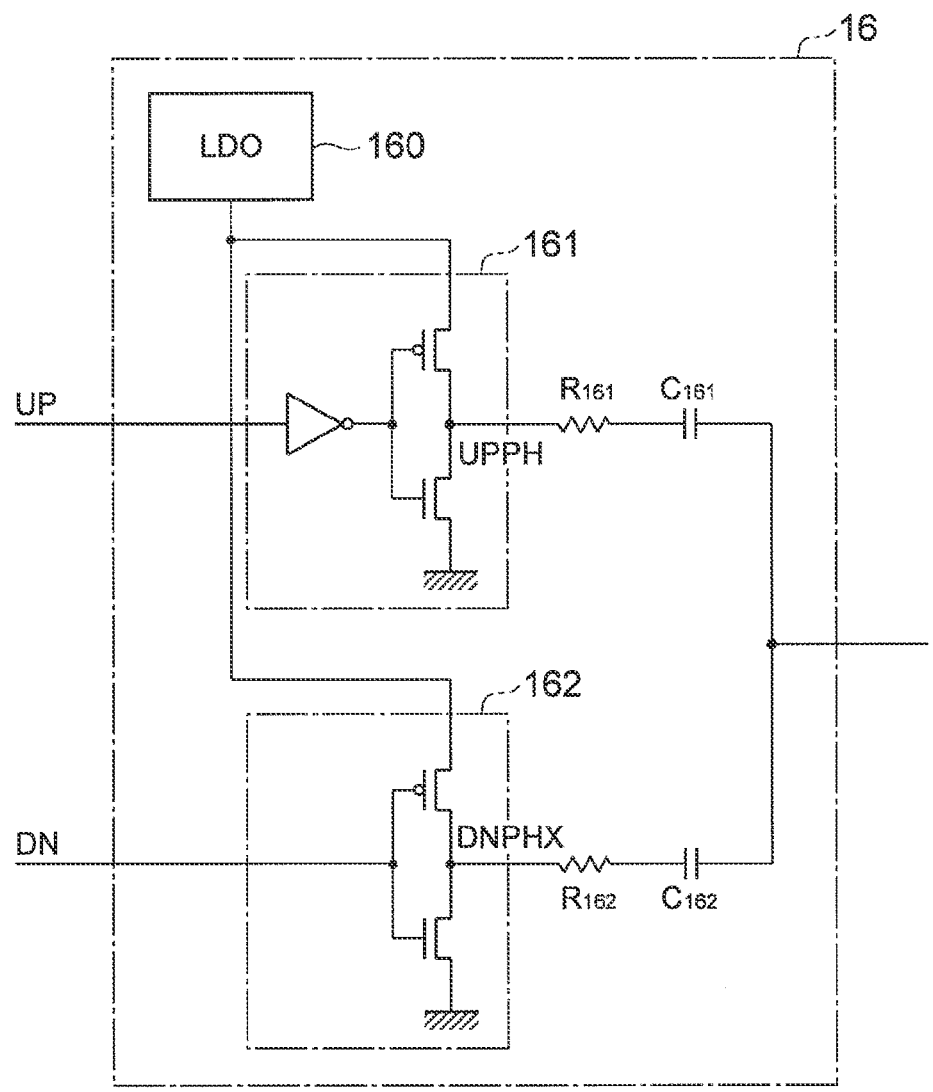
FIG. 12 is a detailed circuit diagram of the potential adjustment portion 16 included in the clock data restoration device 1A of the first embodiment.

FIG. 12 is a detailed circuit diagram of the potential adjustment portion 16 included in the clock data restoration device 1A of the first embodiment. In this figure, the first buffer 161 and the second buffer 162 are shown in the circuit diagram of transistor level. This figure also shows a LDO (low drop out) power supply 160 that drives the first buffer 161 and the second buffer 162.

Variations in the power supply voltage for driving the first buffer 161 and the second buffer 162 can cause jitter in the adjustment of the potential at the first end of the capacitive element 15 by the potential adjustment portion 16. Hence, as a power supply for driving the first buffer 161 and the second buffer 162, the LDO power supply 16 that can supply a stable voltage is preferably used.

The first resistor $R_{161}$ and the second resistor $R_{162}$ may not be provided in the potential adjustment portion 16. However, when the first resistor $R_{161}$ is not provided, since the first buffer 161 directly drives the first capacitive element $C_{161}$, an instantaneous large current is passed, and this may cause the reliability to be reduced. The same is true of a case where the second resistor $R_{162}$ is not provided. Hence, the provision of the first resistor $R_{161}$ and the second resistor $R_{162}$ improves the reliability. Moreover, the provision of these resistors advantageously allows the potential adjustment portion 16 to have the function of a low pass filter.

Figure 13:
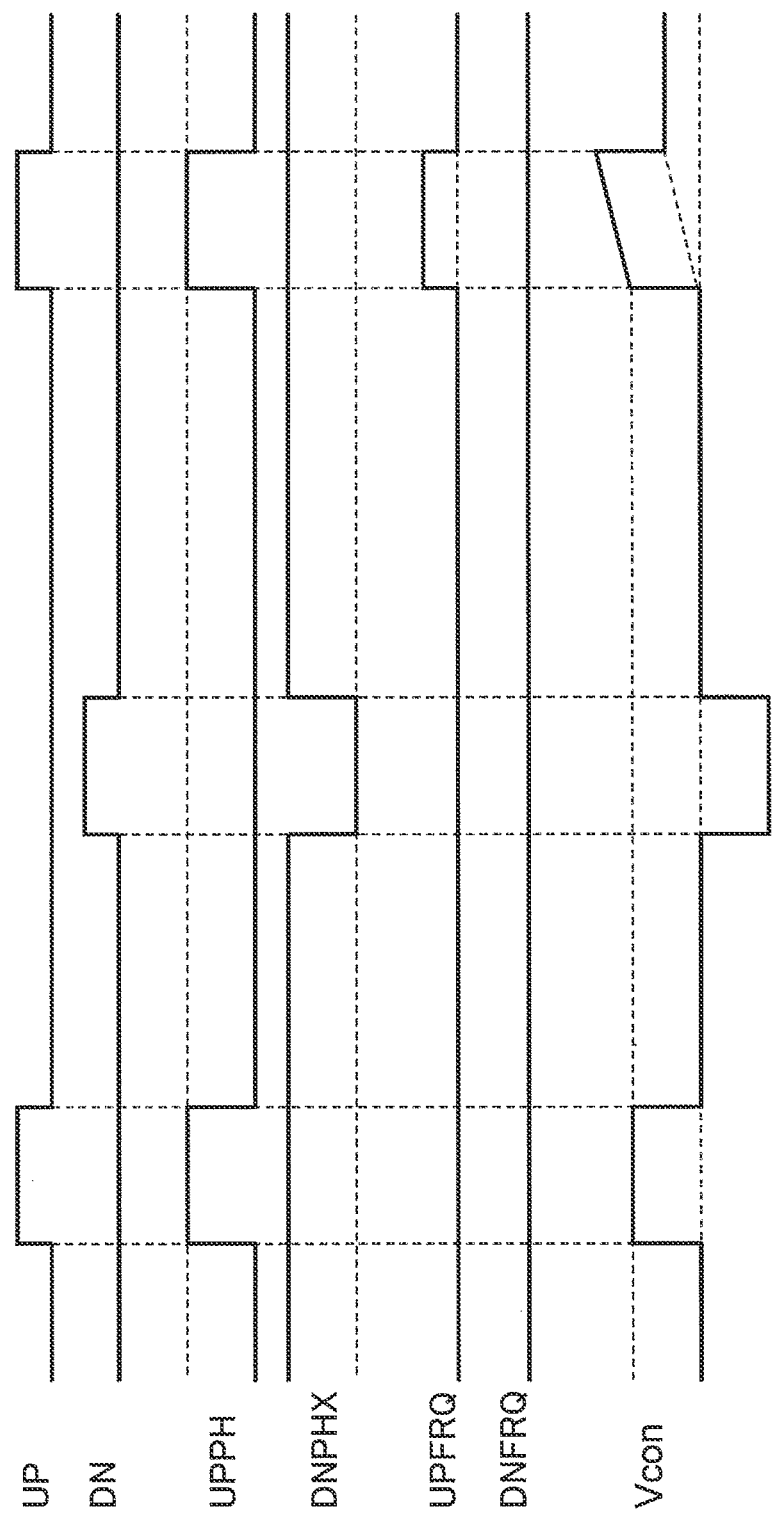
FIG. 13 is a diagram showing an example of the waveforms of individual signals in the clock data restoration device 1A of the first embodiment.

FIG. 13 is a diagram showing an example of the waveforms of individual signals in the clock data restoration device 1A of the first embodiment. Sequentially from above, this figure shows the example of the waveforms of: the first phase difference signal UP output from the phase comparison portion 12; the second phase difference signal DN output from the phase comparison portion 12; an output signal UPPH from the first buffer 161 of the potential adjustment portion 16; an output signal DNPHX from the second buffer 162 of the potential adjustment portion 16; the third phase difference signal UPFRQ output from the drive portion 13; the fourth phase difference signal DNFRQ output from the drive portion 13; and the control voltage value Vcon input to the voltage control oscillator 17.

As shown in this figure, while the first phase difference signal UP is output from the phase comparison portion 12 as a pulse, the control voltage value Vcon input to the voltage control oscillator 17 is adjusted to be high by the potential adjustment portion 16. While the second phase difference signal DN is output from the phase comparison portion 12 as a pulse, the control voltage value Vcon input to the voltage control oscillator 17 is adjusted to be low by the potential adjustment portion 16. While the third phase difference signal UPFRQ is output from the drive portion 13 as a pulse, the capacitive element 15 is charged, and thereafter the value of the control voltage value Vcon after the charging is maintained. While the fourth phase difference signal DNFRQ is output from the drive portion 13 as a pulse, the capacitive element 15 is discharged, and thereafter the value of the control voltage value Vcon after the discharging is maintained.

Here, in the first embodiment, it is assumed that the capacitance value of the capacitive element 15 is $C_{15}$, the capacitance values of the first capacitive element $C_{161}$ and the second capacitive element $C_{162}$ included in the potential adjustment portion 16 are $C_{16}$ and the magnitude of the pulses of the output signals UPPH and DNPHX of the first buffer 161 and the second buffer 162 included in the potential adjustment portion 16 is Vphfb. As shown in FIGS. 11 to 13, the pulses of the output signals UPPH and DNPHX have opposite polarities. In the first comparative example, it is also assumed that the resistance value of the resistor $R_{1A}$ included in the loop filter 25A is $R_1$, and the magnitude of the charge and discharge current Icp output from the charge pump 24 is Ipmp. Here, if a relational formula "Vphfb·$C_{16}$/$C_{15}$=$R_1$·Ipmp" is satisfied, in the first embodiment and the first comparative example, it is possible to obtain the same effects on the adjustment of the phase of the oscillation signals output from the voltage control oscillators 17 and 27. It is preferable to set constant the width of the pulse of the charge and discharge current output from the charge pump 24 regardless of an operational frequency, and thus it is possible to acquire stability regardless of the operational frequency.

Figure 14:
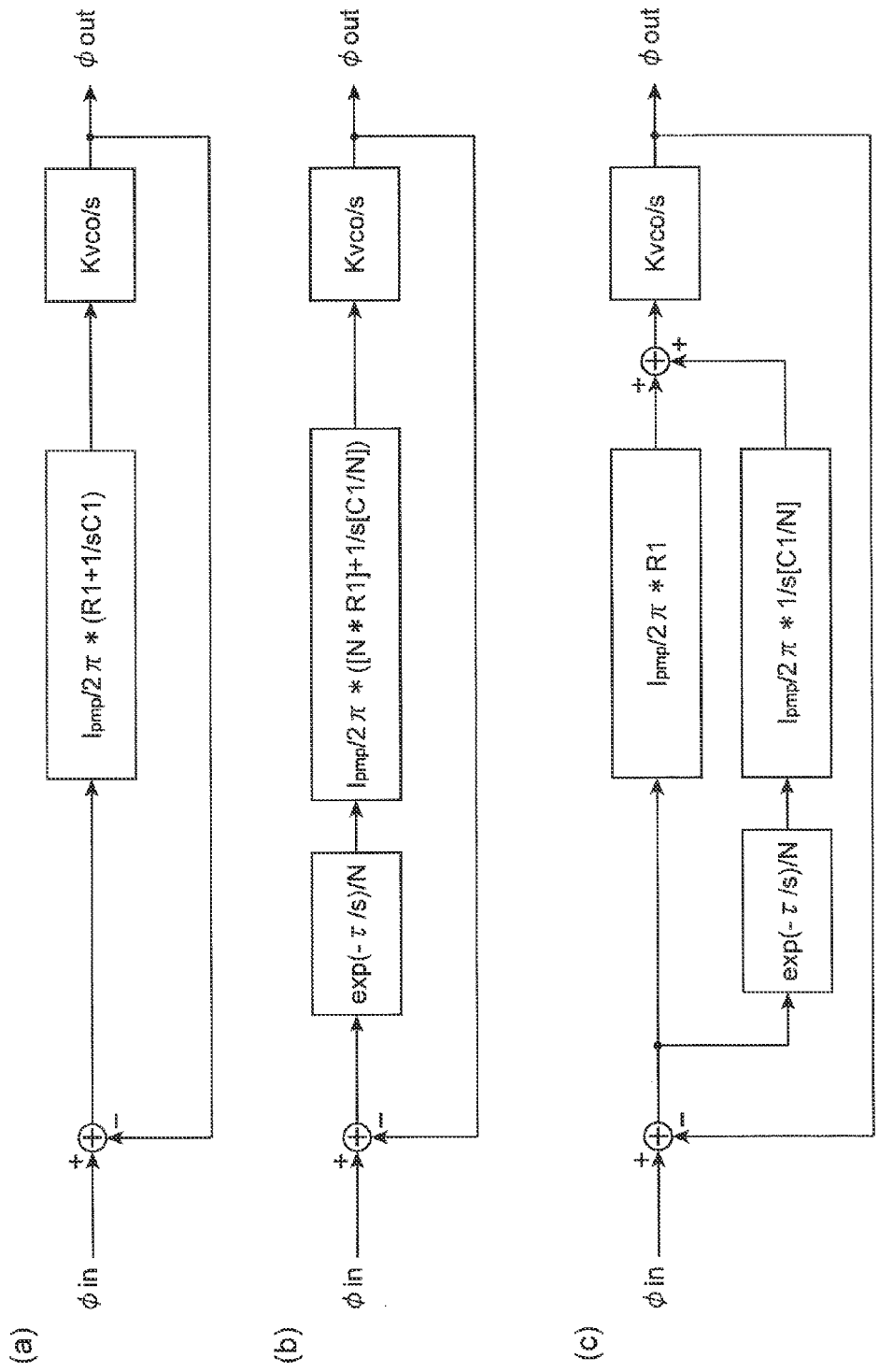
FIG. 14 is a diagram showing a transfer function model in the clock data restoration device of each of the first comparative example, the second comparative example and the first embodiment.

FIG. 14 is a diagram showing a transfer function model in the clock data restoration device of each of the first comparative example, the second comparative example and the first embodiment. FIG. 14(a) shows the transfer function model of the clock data restoration device 2A of the first comparative example; FIG. 14(b) shows the transfer function model of the clock data restoration device 2B of the second comparative example; FIG. 14(c) shows the transfer function model of the clock data restoration device 1A of the first embodiment. The symbol τ in the transfer function models shown in FIGS. 14(b) and 14(c) represents a delay time that is caused by the drive portions 13 and 23, which function as delay elements; it is expressed by a formula "τ=0.5·N·T." T represents the period of the clocks CK and CKX.

In the transfer function model of the clock data restoration device 2B shown in FIG. 14(b), a phase shift that is a delay element and that is caused by the drive portion 13 is present within the loop. Hence, the operation of the clock data restoration device 2B of the second comparative example becomes unstable. On the other hand, in the transfer function model of the clock data restoration device 1A shown in FIG. 14(c), a phase shift that is a delay element and that is caused by the drive portion 13 is restrictively present with respect to an integration term among a proportional term and the integration term that are provided in parallel to each other within the loop. Hence, the operation of the clock data restoration device 1A of the first embodiment becomes stable.

Figure 15:
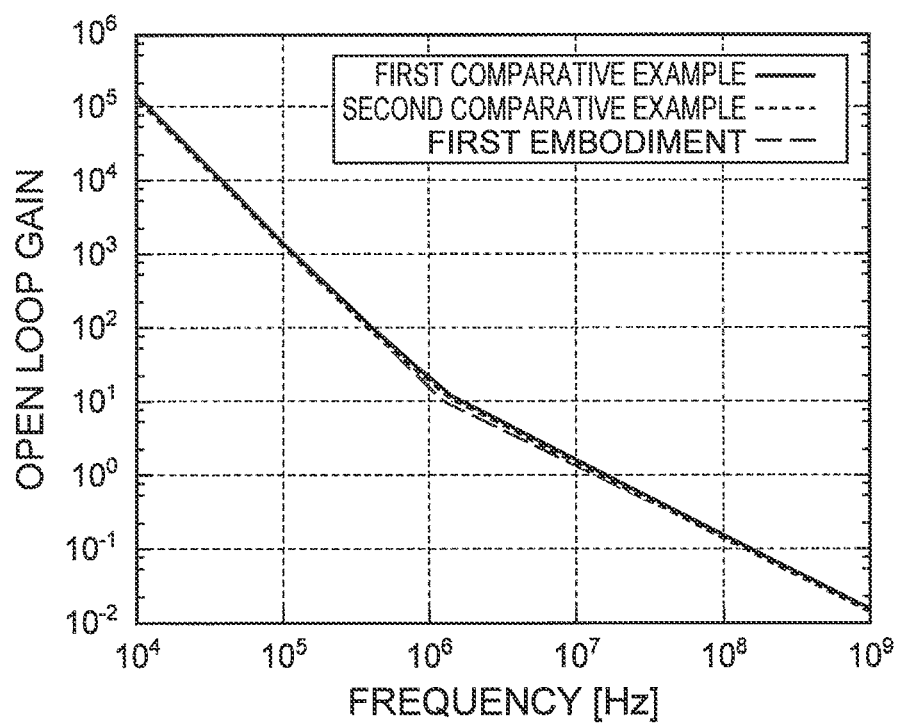
FIG. 15 is a graph showing the frequency dependence of an open loop gain of the clock data restoration device of each of the first comparative example, the second comparative example and the first embodiment.
Figure 16:
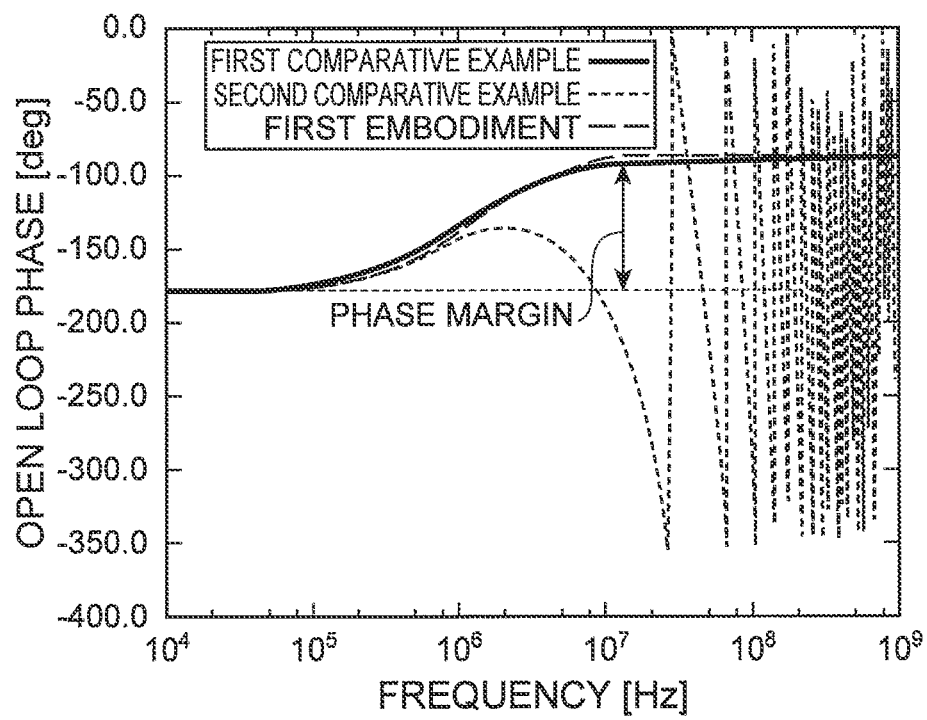
FIG. 16 is a graph showing the frequency dependence of an open loop phase of the clock data restoration device of each of the first comparative example, the second comparative example and the first embodiment.
Figure 17:
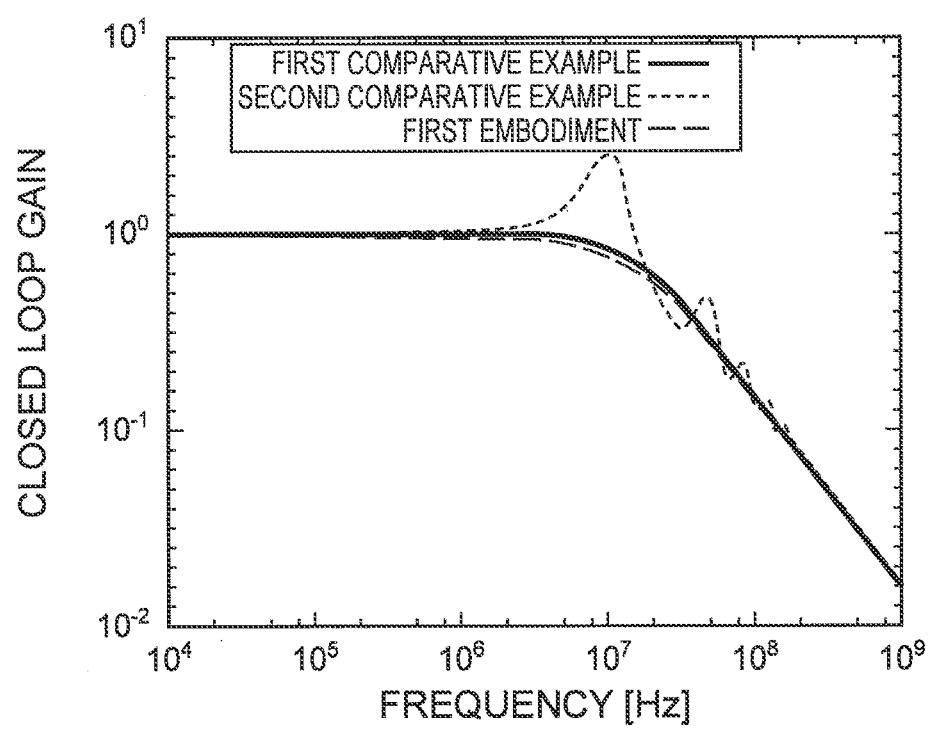
FIG. 17 is a graph showing the frequency dependence of a closed loop gain of the clock data restoration device of each of the first comparative example, the second comparative example and the first embodiment.

FIG. 15 is a graph showing the frequency dependence of an open loop gain of the clock data restoration device of each of the first comparative example, the second comparative example and the first embodiment. FIG. 16 is a graph showing the frequency dependence of an open loop phase of the clock data restoration device of each of the first comparative example, the second comparative example and the first embodiment. FIG. 17 is a graph showing the frequency dependence of a closed loop gain of the clock data restoration device of each of the first comparative example, the second comparative example and the first embodiment. These are calculated based on the transfer function models shown in FIG. 14.

As shown in FIG. 15, there is almost no difference in the frequency dependence of the open loop gain between the clock data restoration devices of the first comparative example, the second comparative example and the first embodiment.

As shown in FIG. 16, with respect to the frequency dependence of the open loop phase, in the clock data restoration device 2B of the second comparative example, since the phase is rotated by the effects of the phase shift caused by the drive portion 23 that is a delay element around a crossover frequency where the open loop gain is 1, no phase margin is present at all. On the other hand, in the clock data restoration device 1A of the first embodiment, as in the clock data restoration device 2A of the first comparative example, the phase margin can be acquired.

Consequently, as shown in FIG. 17, with respect to the frequency dependence of the closed loop gain, in the clock data restoration device 2B of the second comparative example, a peak indicating instability is produced. On the other hand, as in the clock data restoration device 2A of the first comparative example, the clock data restoration device 1A of the first embodiment has a stable characteristic.

As described above, the clock data restoration device 1A of the first embodiment can reduce the increase in the area of the capacitive element 15, can also increase the stability factor $\zeta$ while keeping the phase shift amount $\theta$ constant and can perform a stable operation.

Second Embodiment

Figure 18:
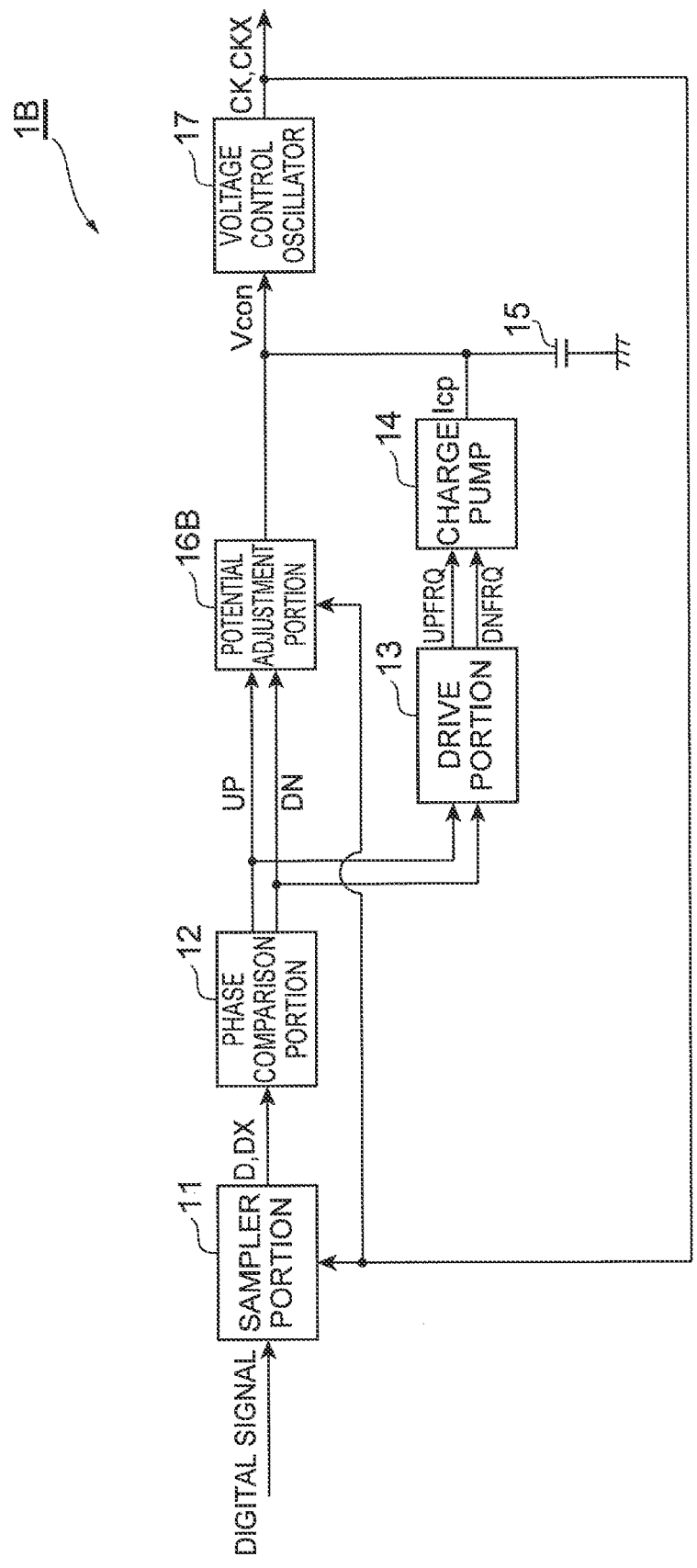
FIG. 18 is a diagram showing the configuration of a clock data restoration device 1B of a second embodiment.

FIG. 18 is a diagram showing the configuration of a clock data restoration device 1B of the second embodiment. The clock data restoration device 1B shown in this figure is a device that restores a clock and data based on an input digital signal; the clock data restoration device 1B includes the sampler portion 11, the phase comparison portion 12, the drive portion 13, the charge pump 14, the capacitive element 15, a potential adjustment portion 16B and the voltage control oscillator 17.

As understood by comparison with the configuration of the clock data restoration device 1A of the first embodiment shown in FIG. 6, the clock data restoration device 1B of the second embodiment shown in FIG. 18 differs from the clock data restoration device 1A in that the potential adjustment portion 16B is included instead of the potential adjustment portion 16.

Figure 19:
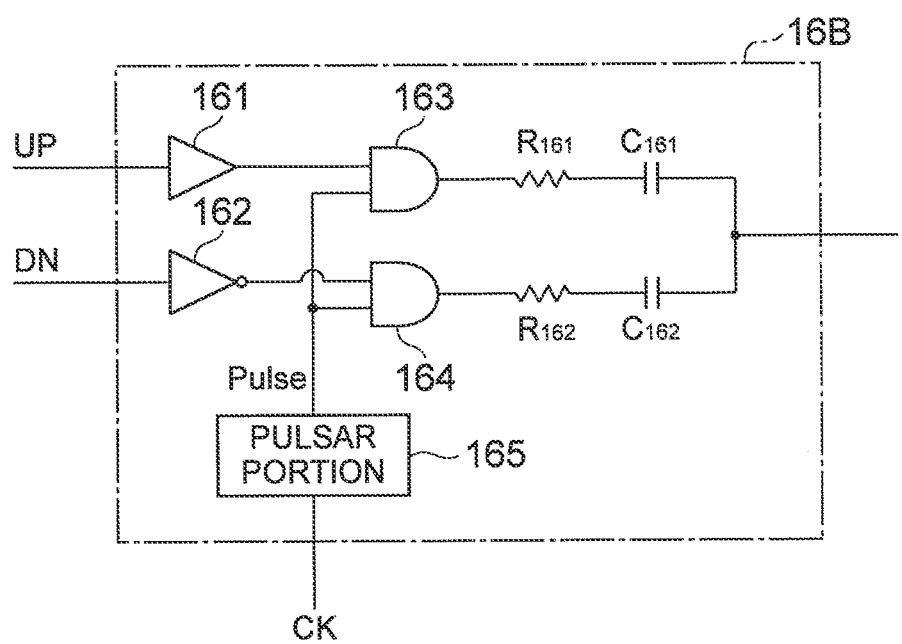
FIG. 19 is a diagram showing an example of the circuit of a potential adjustment portion 16B included in the clock data restoration device 1B of the second embodiment.

FIG. 19 is a diagram showing an example of the circuit of the potential adjustment portion 16B included in the clock data restoration device 1B of the second embodiment. As shown in this figure, the potential adjustment portion 16B includes the first buffer 161, the second buffer 162, the first resistor $R_{161}$, the second resistor $R_{162}$, the first capacitive element $C_{161}$ and the second capacitive element $C_{162}$, and further includes a first AND circuit portion 163, a second AND circuit portion 164 and a pulsar portion 165. As understood by comparison with the configuration of the potential adjustment portion 16 of the first embodiment shown in FIG. 11, the potential adjustment portion 16B of the second embodiment shown in FIG. 19 differs from the potential adjustment portion 16 in that the first AND circuit portion 163, the second AND circuit portion 164 and the pulsar portion 165 are further included.

The pulsar portion 165 inputs the clock CK or the clock CKX output from the voltage control oscillator 17, and outputs a pulse signal Pulse of the same period as this clock. The first AND circuit portion 163 is provided between the first buffer 161 and the first resistor $R_{161}$, and inputs an output signal of the first buffer 161 and an output signal Pulse of the pulsar portion 165 and outputs a signal indicating the AND of these two signals to the first resistor $R_{161}$. The second AND circuit portion 164 is provided between the second buffer 162 and the second resistor $R_{162}$, and inputs an output signal of the second buffer 162 and an output signal Pulse of the pulsar portion 165 and outputs a signal indicating the AND of these two signals to the second resistor $R_{162}$.

Figure 20:
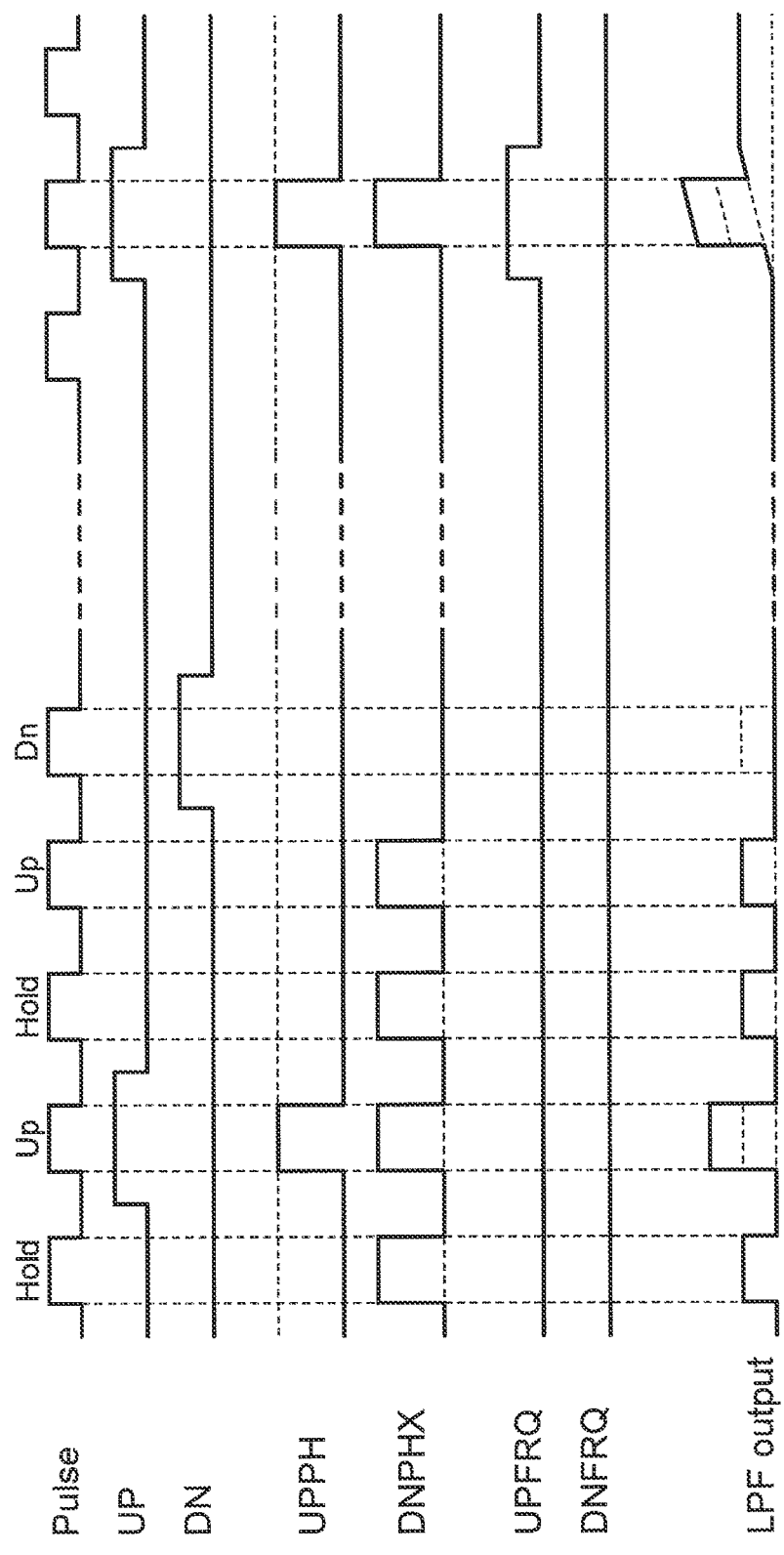
FIG. 20 is a diagram showing an example of the waveforms of individual signals in the clock data restoration device 1B of the second embodiment.

FIG. 20 is a diagram showing an example of the waveforms of individual signals in the clock data restoration device 1B of the second embodiment. Sequentially from above, this figure shows the example of the waveforms of: the output signal Pulse from the pulsar portion 165 of the potential adjustment portion 16B; the first phase difference signal UP output from the phase comparison portion 12; the second phase difference signal DN output from the phase comparison portion 12; the output signal UPPH from the first buffer 161 of the potential adjustment portion 16B; the output signal DNPHX from the second buffer 162 of the potential adjustment portion 16B; the third phase difference signal UPFRQ output from the drive portion 13; the fourth phase difference signal DNFRQ output from the drive portion 13; and the control voltage value Vcon input to the voltage control oscillator 17.

As shown in this figure, in the second embodiment, not only the output signal UPPH from the first buffer 161 of the potential adjustment portion 16B but also the output signal DNPHX from the second buffer 162 of the potential adjustment portion 16B are positive pulses. When neither the first phase difference signal UP nor the second phase difference signal DN is a significant value (when being held in FIG. 9), the signal UPPH is low, and the signal DNPHX is high.

It is assumed that the capacitance of the capacitive element 15 is $C_{15}$, the capacitance of the first capacitive element $C_{161}$ and the second capacitive element $C_{162}$ is $C_{16}$ and the magnitude of the pulses of the output signals UPPH and DNPHX of the first buffer 161 and the second buffer 162 is Vphfb. Here, when the first phase difference signal UP is a significant value, both the signal UP and the signal DNPHX are high, and the control voltage value Vcon is higher by Vphfb·$C_{16}/C_{15}$ than the case of Hold. When the second phase difference signal DN is a significant value, both the signal UPPH and the signal DNPHX are low, and the control voltage value Vcon is lower by Vphfb·$C_{16}/C_{15}$ than the case of Hold.

When the potential adjustment portion 16B configured as described above is used, the potential (the control voltage value Vcon) at the first end of the capacitive element 15 is little affected by variations in the power supply. Hence, in the potential adjustment portion 16B, unlike the first embodiment, the LDO power supply needs to be used.

Third Embodiment

Figure 21:
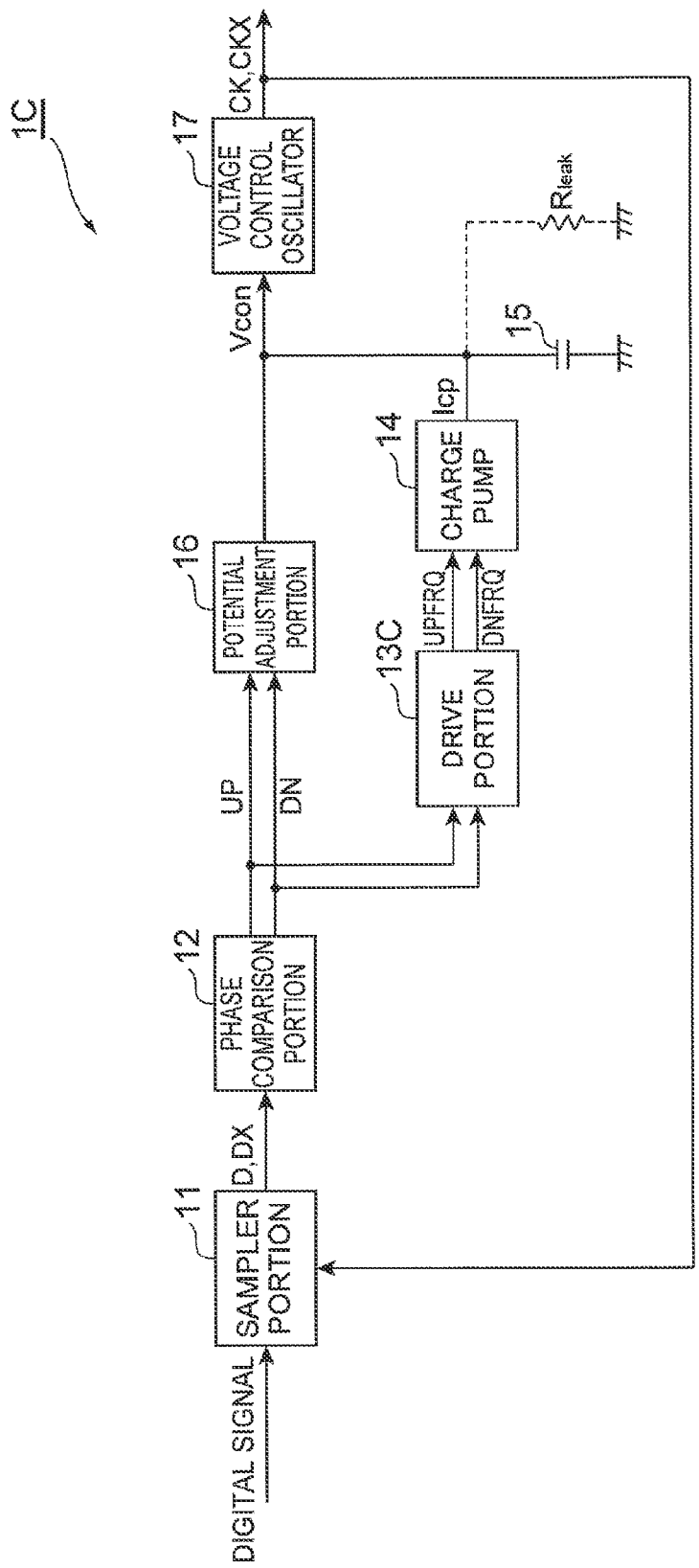
FIG. 21 is a diagram showing the configuration of a clock data restoration device 1C of a third embodiment.

FIG. 21 is a diagram showing the configuration of a clock data restoration device 1C of the third embodiment. The clock data restoration device 1C shown in this figure is a device that restores a clock and data based on an input digital signal; the clock data restoration device 1C includes the sampler portion 11, the phase comparison portion 12, a drive portion 13C, the charge pump 14, the capacitive element 15, the potential adjustment portion 16 and the voltage control oscillator 17.

As understood by comparison with the configuration of the clock data restoration device 1A of the first embodiment shown in FIG. 6, the clock data restoration device 1C of the third embodiment shown in FIG. 21 differs from the clock data restoration device 1A in that the drive portion 13C is included instead of the drive portion 13C.

When a MOS capacity is used as the capacitive element 15, especially in the fine process of 90 nm or less, the charge of the capacitive element 15 disadvantageously leaks. A resistor Rleak shown in FIG. 21 is an equivalent resistor when the charge leaks. When the charge of the capacitive element 15 leaks, even if the capacitive element 15 is charged or discharged by the charge and discharge current Icp output from the charge pump 14, part of the charge fed to the capacitive element 15 by the charging or the discharging leaks through the resistor Rleak. Although, without the leakage, the first phase difference signal UP and the second phase difference signal DN output from the phase comparison portion 12 would become a significant value at the same frequency, due to the leakage, the clocks CK and CKX output from the voltage control oscillator 17 are locked when any one of the first phase difference signal UP and the second phase difference signal DN becomes a significant value at a higher frequency than at the frequency of the other signal. The clock data restoration device 1C of the third embodiment includes the drive portion 13C so as to cope with the problem described above.

Figure 22:
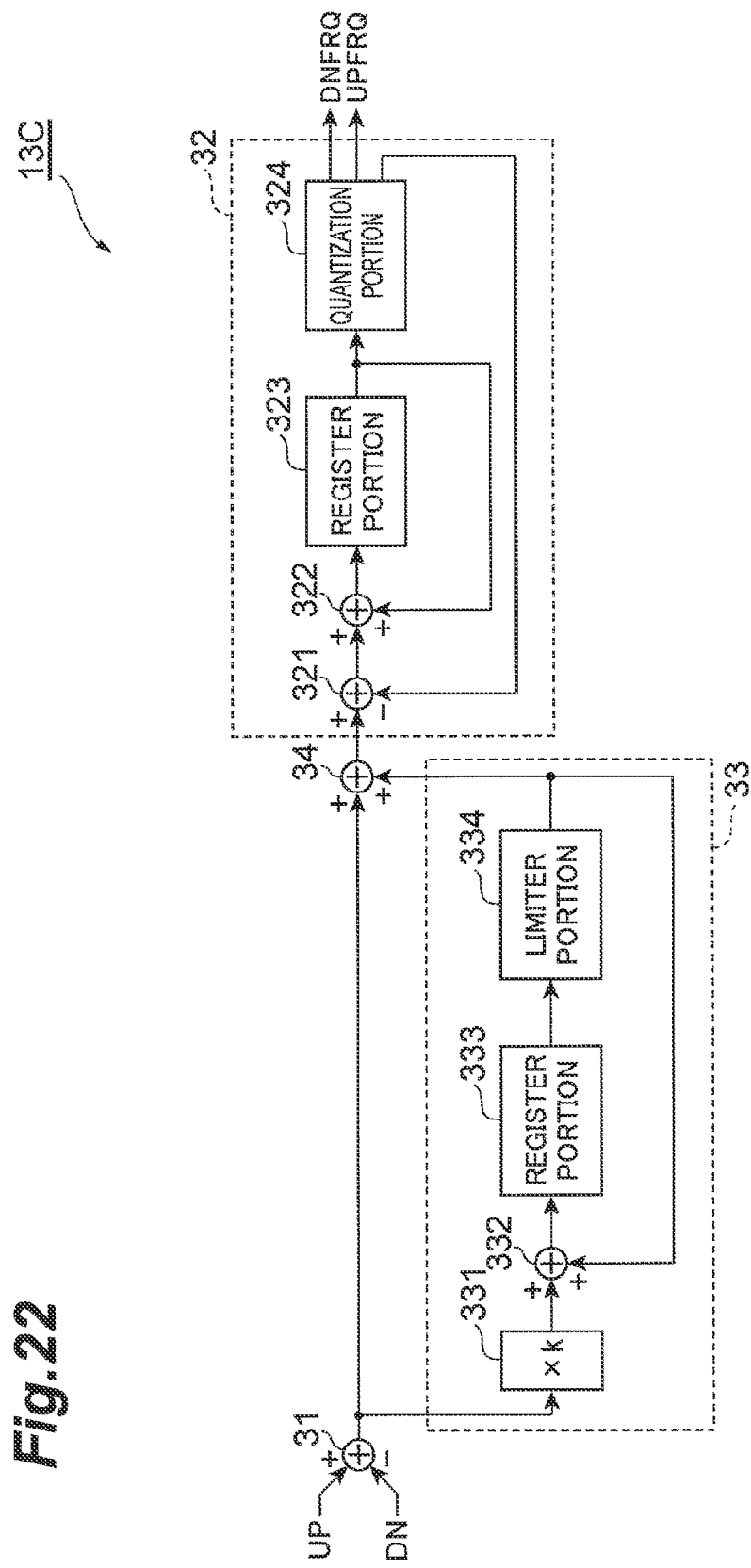
FIG. 22 is a diagram showing an example of the configuration of a drive portion 13C included in the clock data restoration device 1C of the third embodiment.

FIG. 22 is a diagram showing an example of the configuration of the drive portion 13C included in the clock data restoration device 1C of the third embodiment. As shown in the figure, the drive portion 13C includes the decimeter portion 31, the delta sigma modulation portion 32, an integration portion 33 and an addition portion 34. As understood by comparison with the configuration of the drive portion 13 of the first embodiment shown in FIG. 10, the drive portion 13C of the third embodiment shown in FIG. 22 differs from the drive portion 13 in that the integration portion 33 and the addition portion 34 are further included.

The integration portion 33 includes a multiplication portion 331, an addition portion 332, a register portion 333 and a limiter portion 334. The multiplication portion 331 multiplies the output value of the decimeter portion 31 by a positive constant k, and outputs the result of the multiplication to the addition portion 332. The addition portion 332 adds the output value of the multiplication portion 331 and the output value of the limiter portion 334, and outputs the result of the addition to the register portion 333. The register portion 333 delays the output value of the addition portion 332 by the duration of the M periods, and outputs the value after the delay to the limiter portion 334.

The limiter portion 334 inputs the output value of the register portion 333. Then, if the input value falls within a predetermined range, the limiter portion 334 outputs the input value to the addition portion 332 and the addition portion 34 without the input value being processed; if the input value is higher than the upper limit of the predetermined range, the limiter portion 334 outputs the upper limit value to the addition portion 332 and the addition portion 34; if the input value is lower than the lower limit value of the predetermined range, the limiter portion 334 outputs the lower limit value to the addition portion 332 and the addition portion 34.

With a loop configured to include the multiplication portion 331, the addition portion 332, the register portion 333 and the limiter portion 334, the integration portion 33 outputs a value corresponding to a value obtained by accumulatively adding the output value of the decimeter portion 31. The addition portion 34 adds the output value of the decimeter portion 31 and the output value of the multiplication portion 33, and outputs the result of the addition to the delta sigma modulation portion 32. In other words, the delta sigma modulation portion 32 adds the output value of the decimeter portion 31 and the output value of the integration portion 33 to the variable Δ.

The drive portion 13C configured as described above determines, with the integration portion 33, the value corresponding to the value obtained by accumulatively adding the output value of the decimeter portion 31, and inputs, to the delta sigma modulation portion 32, the addition value of the accumulative addition value determined with the integration portion 33 and the output value of the decimeter portion 31. Then, the delta sigma modulation portion 32 outputs, from the register portion 323, as the value of the variable Δ, the value of the result of the addition of the input value to the variable Δ. In the delta sigma modulation portion 32, when the value of the variable Δ becomes equal to or more than +N, the quantization portion 324 outputs the third phase difference signal UPFRQ indicating this fact, and the subtraction portion 321 subtracts the value N from the variable Δ. Moreover, in the delta sigma modulation portion 32, when the value of the variable Δ becomes equal to or less than −N, the quantization portion 324 outputs the fourth phase difference signal DNFRQ indicating this fact, and the subtraction portion 321 adds the value N to the variable Δ.

For example, when the integration portion 33 is not provided, part of the charge of the capacitive element 15 leaks through the resistor Rleak, and thus the first phase difference signal UP output from the phase comparison portion 12 becomes a significant value at a frequency higher than the frequency of the second phase difference signal DN. Here, in the drive portion 13C, a value corresponding to the difference between the frequency at which the first phase difference signal UP becomes a significant value and the frequency at which the second phase difference signal DN becomes a significant value is output from the integration portion 33, and the addition value of the output value of the integration portion 33 and of the output value of the decimeter portion 31 is input to the delta sigma modulation portion 32.

The delta sigma modulation portion 32 to which the addition value is input as described above performs processing, and thus the third phase difference signal UPFRQ output from the drive portion 13C becomes a significant value at a frequency higher than the frequency of the fourth phase difference signal DNFRQ. At the time of stability, the first phase difference signal UP and the second phase difference signal DN output from the phase comparison portion 12 can become a significant value at the same frequency. In this way, it is possible to cancel the leakage of the charge of the capacitive element 15.

In the present embodiment, the integration portion 33 includes the limiter portion 334, and thus the accumulative addition value (that is, the output value of the integration portion 33) in the integration portion 33 is prevented from exceeding the predetermined range, with the result that it is possible to prevent the malfunction of the drive portion 13C.

Fourth Embodiment

Figure 23:
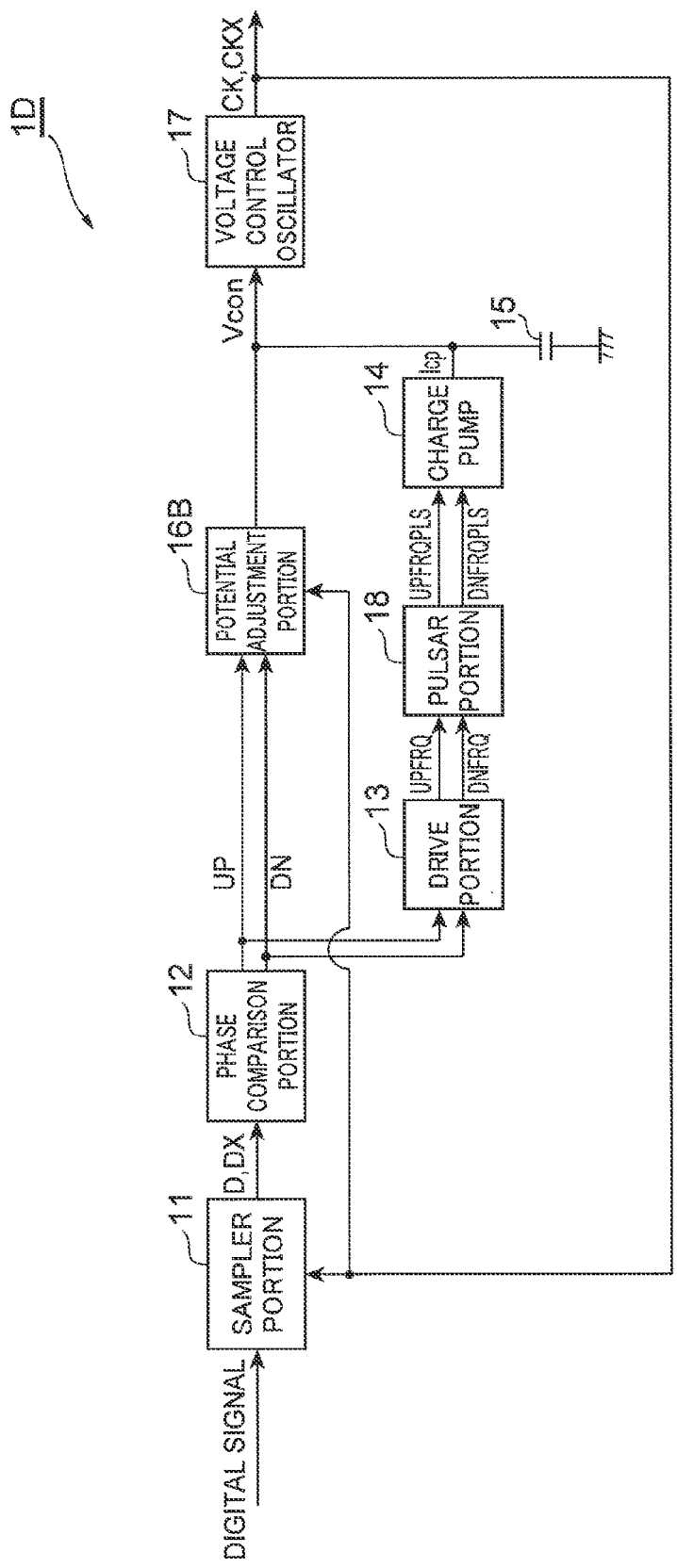
FIG. 23 is a diagram showing the configuration of a clock data restoration device 1D of a fourth embodiment.

FIG. 23 is a diagram showing the configuration of a clock data restoration device 1D of the fourth embodiment. The clock data restoration device 1D shown in this figure is a device that restores a clock and data based on an input digital signal; the clock data restoration device 1D includes the sampler portion 11, the phase comparison portion 12, the drive portion 13, the charge pump 14, the capacitive element 15, the potential adjustment portion 16B, the voltage control oscillator 17 and a pulsar portion 18.

As understood by comparison with the configuration of the clock data restoration device 1B of the second embodiment shown in FIG. 18, the clock data restoration device 1D of the fourth embodiment shown in FIG. 23 differs from the clock data restoration device 1B in that the pulsar portion 18 provided between the drive portion 13 and the charge pump 14 is further included. The pulsar portion 18 inputs the third phase difference signal UPFRQ and the fourth phase difference signal DNFRQ output from the drive portion 13. Then, the pulsar portion 18 outputs, to the charge pump 14, the third phase difference signal UPFRQ and the fourth phase difference signal DNFRQ, as signals having a constant pulse width (third phase difference signal UPFRQPLS and fourth phase difference signal DNFRQPLS). The charge pump 14 outputs a charge and discharge current based on the third phase difference signal UPFRQPLS and the fourth phase difference signal DNFRQPLS that are output from the drive portion 13 and that are determined by the pulsar portion 18 to have a constant pulse width.

Figure 24:
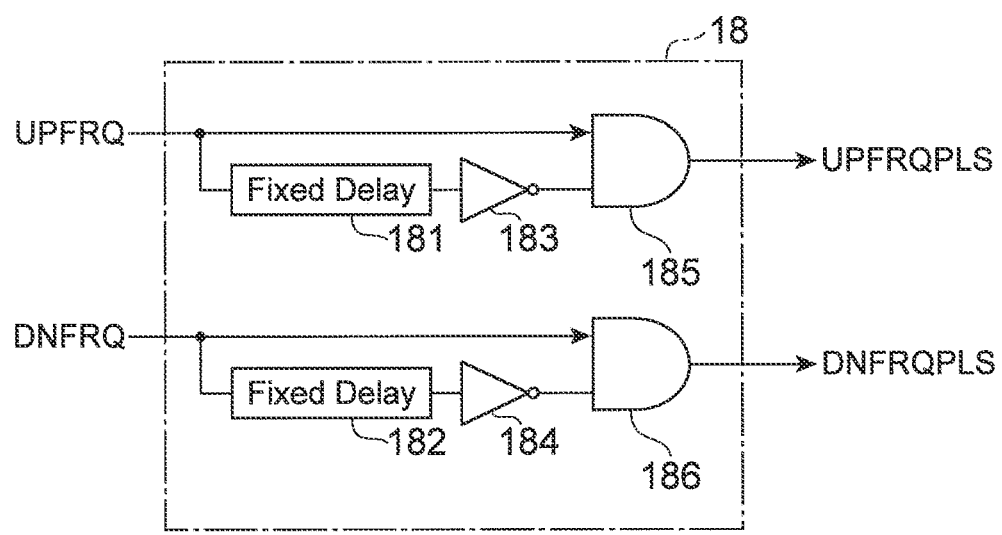
FIG. 24 is a diagram showing the configuration of a pulsar portion 18 included in the clock data restoration device 1D of the fourth embodiment.

FIG. 24 is a diagram showing the configuration of the pulsar portion 18 included in the clock data restoration device 1D of the fourth embodiment. The pulsar portion 18 includes a first delay circuit 181, a second delay circuit 182, a first logical inversion circuit 183, a second logical inversion circuit 184, a first AND circuit 185 and a second AND circuit 186.

The first delay circuit 181 inputs the third phase difference signal UPFRQ output from the drive portion 13, provides a fixed delay to the third phase difference signal UPFRQ and outputs the third phase difference signal UPFRQ that has received the delay to the first logical inversion circuit 183. The first logical inversion circuit 183 inputs the third phase difference signal UPFRQ output from the first delay circuit 181, and performs logical inversion on the third phase difference signal UPFRQ and outputs it to the first AND circuit 185. The first AND circuit 185 inputs the third phase difference signal UPFRQ output from the drive portion 13, inputs a signal output from the first logical inversion circuit 183, performs an AND operation on these two signals and outputs the value of the AND as the third phase difference signal UPFRQPLS to the charge pump 14. The third phase difference signal UPFRQPLS has a constant pulse width regardless of an operational frequency.

The second delay circuit 182 inputs the fourth phase difference signal DNFRQ output from the drive portion 13, provides a fixed delay to the fourth phase difference signal DNFRQ and outputs the fourth phase difference signal DNFRQ that has received the delay to the second logical inversion circuit 184. The second logical inversion circuit 184 inputs the fourth phase difference signal DNFRQ output from the second delay circuit 182, and performs logical inversion on the fourth phase difference signal DNFRQ and outputs it to the second AND circuit 186. The second AND circuit 186 inputs the fourth phase difference signal DNFRQ output from the drive portion 13, inputs a signal output from the second logical inversion circuit 184, performs an AND operation on these two signals and outputs the value of the AND as the fourth phase difference signal DNFRQPLS to the charge pump 14. The fourth phase difference signal DNFRQPLS has a constant pulse width regardless of an operational frequency.

The stability of the operation of the clock data restoration device of each embodiment will be described below. The stability factor $\zeta$ is expressed by a ratio of a phase feedback $\Delta\theta bb$ during update to a frequency feedback $\Delta\theta int$.

$$\Delta\theta bb = Kvco*(Cph/C1)*Vph*tph$$

$$\Delta\theta int = Kvco*(Ifq/Nfq)*tfq/C1*tupdate$$

Here, since the period of the phase feedback is tbit, it is assumed that tupdate=tbit, the stability factor $\zeta$ is expressed by the following formula.

$$\zeta = \Delta\theta bb / \Delta\theta int$$
$$= (Cph*Vph*tph*Nfq)/(Ipmp*tfq*tbit)$$

The individual parameters are as follows.

| | |
|---|---|
| Cph: | capacity for phase feedback |
| Vph: | voltage for phase feedback |
| tph: | pulse width for phase feedback |
| Nfq: | attenuation ratio for frequency feedback |
| Ipmp: | current for frequency feedback |
| tfq: | pulse width for frequency feedback |

In each of the first to third embodiments where the pulsar portion 18 is not provided, since tph and tfq are proportional to a bit frequency tbit, the stability factor $\zeta$ is expressed by the following formula. Nfq is increased, and thus $\zeta$ is increased, with the result that the stability can be acquired. However, when a low-frequency operation is performed, tbit is increased, and thus $\zeta$ is disadvantageously decreased.

$$\zeta = \Delta\theta bb / \Delta\theta int$$
$$= (Cph*Vph*tph*Nfq)/(Ipmp*tfq*tbit)$$
$$\propto (Cph*Vph*Nfq)/(Ipmp*tbit)$$

On the other hand, in the fourth embodiment where the pulsar portion 18 is provided, although tph is proportional to the bit frequency tbit, since tfq is a fixed value, the stability factor $\zeta$ is expressed by the following formula. As described above, $\zeta$ does not depend on the operational frequency, and thus it is possible to acquire stability.

$$\zeta = \Delta\theta bb / \Delta\theta int$$
$$= (Cph*Vph*tph*Nfq)/(Ipmp*tfq*tbit)$$
$$\propto (Cph*Vph*Nfq)/(Ipmp*tfq)$$

Although the clock data restoration device 1D of the fourth embodiment is the clock data restoration device obtained by providing the pulsar portion 18 between the drive portion 13 and the charge pump 14 in the configuration of the clock data restoration device 1B of the second embodiment, in the configuration of the clock data restoration device 1A or 1C of the first or third embodiment, the pulsar portion 18 may be provided between the drive portion 13 and the charge pump 14.

REFERENCE SIGNS LIST 1A, 1B, 1C, 1D, 2A and 2B: clock data restoration device, 11: sampler portion, 12: phase comparison portion, 13, 13C: drive portion, 14: charge pump, 15: capacitive element, 16, 16B: potential adjustment portion, 17: voltage control oscillator, 18: pulsar portion, 21: sampler portion, 22: phase comparison portion, 23: drive portion, 24: charge pump, 25A and 25B: loop filter, 27: voltage control oscillator, 31: decimeter portion, 32: delta sigma modulation portion, 33: integration portion

The invention claimed is:

1. A clock data restoration device that restores a clock and data based on an input digital signal, the clock data restoration device comprising:
a sampler portion that inputs a clock CK and a clock CKX which have a same frequency and whose phases differ by π, that inputs the digital signal and that samples, holds and outputs a value D of the digital signal at a time indicated by the clock CK and a value DX of the digital signal at a time indicated by the clock CKX;
a phase comparison portion that compares, based on the value D and the value DX output from the sampler portion, phases of the digital signal and the clock CKX every period of the clock CKX, and that outputs a first phase difference signal which is a significant value when the phase of the clock CKX delays with respect to the digital signal or a second phase difference signal which is a significant value when the phase of the clock CKX advances with respect to the digital signal;
a drive portion which inputs the first phase difference signal and the second phase difference signal output from the phase comparison portion, which, when it is assumed that $\Delta$ represents a variable, that $0<\delta<N$ holds true, that the value $\delta$ is added to the variable $\Delta$ if the first phase difference signal becomes a significant value every period, that the value $\delta$ is subtracted from the variable $\Delta$ if the second phase difference signal becomes a significant value every period, that the value N is subtracted from the variable $\Delta$ if the value of the variable $\Delta$ becomes equal to or more than +N and that the value N is added to the variable $\Delta$ if the value of the variable $\Delta$ becomes equal to or less than −N, outputs, if the value of the variable $\Delta$ becomes equal to or more than +N, a third phase difference signal indicating this fact and which outputs, if the value of the variable $\Delta$ becomes equal to or less than −N, a fourth phase difference signal indicating this fact,
a charge pump that outputs a charge and discharge current based on the third phase difference signal and the fourth phase difference signal output from the drive portion;
a capacitive element that has a first end connected to an output end of the charge pump and a second end connected to a reference potential, that inputs the charge and discharge current output from the charge pump to the first end, that is charged and discharged and that outputs a voltage value at the first end;
a potential adjustment portion that inputs the first phase difference signal and the second phase difference signal output from the phase comparison and that increases or decreases a potential at the first end of the capacitive element according to a phase difference indicated by the first and second phase difference signals; and
a voltage control oscillator that inputs the voltage value at the first end of the capacitive element and that outputs, to the sampler portion, as the clock CK and the clock CKX, an oscillation signal having a frequency corresponding to the input voltage value.

2. The clock data restoration device according to claim 1, wherein the drive portion includes:
a decimeter portion that inputs the first phase difference signal and the second phase difference signal output from the phase comparison portion and that outputs a value $m\delta$ indicating a difference m of a number of periods at which each of the first phase difference signal and the second phase difference signal becomes a significant value during duration of a predetermined number of periods; and
a delta sigma modulation portion that inputs the value $m\delta$ output from the decimeter portion, that adds the value $m\delta$ to the variable $\Delta$, that outputs, if the value of the variable $\Delta$ becomes equal to or more than +N, the third phase difference signal indicating this fact and subtracts the value N from the variable $\Delta$ and that outputs, if the value of the variable $\Delta$ becomes equal to or less than −N, the fourth phase difference signal indicating this fact and adds the value N to the variable $\Delta$.

3. The clock data restoration device according to claim 2, wherein the drive portion includes an integration portion that inputs the value $m\delta$ output from the decimeter portion and that outputs a value corresponding to a value obtained by accumulatively adding the value $m\delta$, and
the delta sigma modulation portion adds, to the variable $\Delta$, the value $m\delta$ output from the decimeter portion and the value output from the integration portion.

4. The clock data restoration device according to claim 3, wherein the integration portion includes a limiter portion that prevents the value obtained by accumulatively adding the value $m\delta$ from exceeding a predetermined range.

5. The clock data restoration device according to claim 1, wherein the potential adjustment portion includes:
a first buffer that inputs the first phase difference signal output from the phase comparison portion;
a first capacitive element that is provided between an output end of the first buffer and the first end of the capacitive element;
a second buffer that inputs the second phase difference signal output from the phase comparison portion and that outputs a signal of a polarity opposite a polarity of the output of the first buffer; and
a second capacitive element that is provided between an output end of the second buffer and the first end of the capacitive element.

6. The clock data restoration device according to claim 5, wherein the potential adjustment portion includes:
a first resistor that is provided between the output end of the first buffer and the first capacitive element; and
a second resistor that is provided between the output end of the second buffer and the second capacitive element.

7. The clock data restoration device according to claim 5, wherein the potential adjustment portion includes:
an LDO power supply that drives the first buffer and the second buffer.

8. The clock data restoration device according to claim 5, wherein the potential adjustment portion includes:
a pulsar portion that outputs a pulse signal having a same period as the clock CK and the clock CKX;
a first AND circuit portion that is provided between the first buffer and the first capacitive element, that performs an AND operation on an output pulse signal of the pulsar portion and an output value of the first buffer and that outputs a value of the AND operation to the first capacitive element; and a second AND circuit portion that is provided between the second buffer and the second capacitive element, that performs an AND operation on the output pulse signal of the pulsar portion and an output value of the second buffer and that outputs a value of the AND operation to the second capacitive element.

9. The clock data restoration device according to claim 1, further comprising:
a pulsar portion that is provided between the drive portion and the charge pump, that determines that the third phase difference signal and the fourth phase difference signal output form the drive portion have a predetermined pulse width and that outputs the third phase difference signal and the fourth phase difference signal to the charge pump,
wherein the charge pump outputs a charge and discharge current based on the third phase difference signal and the fourth phase difference signal that are output from the drive portion and that are determined to have the predetermined pulse width.

* * * * *